(12) United States Patent
Otaguro

(10) Patent No.: US 6,966,045 B2
(45) Date of Patent: Nov. 15, 2005

(54) METHOD AND COMPUTER PROGRAM PRODUCT FOR ESTIMATING WIRE LOADS

(75) Inventor: Yukio Otaguro, Kanagawa-Ken (JP)

(73) Assignee: Kabushiki Kaisha Toshiba, Kanagawa-Ken (JP)

( * ) Notice: Subject to any disclaimer, the term of this patent is extended or adjusted under 35 U.S.C. 154(b) by 724 days.

(21) Appl. No.: 09/748,901

(22) Filed: Dec. 27, 2000

(65) Prior Publication Data

US 2002/0010901 A1 Jan. 24, 2002

(30) Foreign Application Priority Data

Dec. 27, 1999 (JP) .......................................... P11-371859
Jun. 29, 2000 (JP) ..................................... P2000-196811

(51) Int. Cl.[7] .............................................. G06F 17/50
(52) U.S. Cl. ................................. 716/18; 716/2; 716/4; 716/5; 716/12
(58) Field of Search .............................. 716/12, 18, 1, 716/2, 4, 5; 713/503

(56) References Cited

U.S. PATENT DOCUMENTS

| | | | |
|---|---|---|---|
| 5,790,841 A | * | 8/1998 | Scherer et al. .............. 713/503 |
| 5,987,086 A | * | 11/1999 | Raman et al. .................. 716/1 |
| 6,266,803 B1 | * | 7/2001 | Scherer et al. ................ 716/12 |
| 6,510,542 B1 | | 1/2003 | Kojima |

FOREIGN PATENT DOCUMENTS

JP    HEI 07-105240    4/1995

* cited by examiner

*Primary Examiner*—Thuan Do
(74) *Attorney, Agent, or Firm*—Brenda O. Holmes; Kilpatrick Stockton LLP

(57) ABSTRACT

A wire load estimating method comprises (1) reading a netlist; (2) generating connection information including the names of signals, the identification names and the names of pins of instances which include cells, macro blocks and synthesized blocks as described in the netlist; (3) dividing an area of a chip into two or more regions and determining connection point coordinates for each of the regions by the use of the connection information and locations of the instances as placed; (4) determining a wiring path by the use of the connection point coordinates; and (5) estimating a wire capacitance value and a wire resistance value with reference to the wiring path.

12 Claims, 22 Drawing Sheets

FIG. 1

| NUMBER OF CONNECTION POINTS | WIRE RESISTANCE VALUE | WIRE CAPACITANCE VALUE |
|---|---|---|
| 2 | 10 | 100 |
| 3 | 20 | 150 |
| 4 | 50 | 260 |
| 5 | 80 | 350 |
| 6 | 100 | 500 |
| ⋮ | ⋮ | ⋮ |
| ⋮ | ⋮ | ⋮ |

FIG. 5

THE CENTER COORDINATES ARE (x = 1000, y = 2000)

THE BOTTOM LEFT VERTEX COORDINATES ARE (x = 3000, y = 5000)
THE TOP RIGHT VERTEX COORDINATES ARE (x = 3500, y = 6000)

THE BOTTOM LEFT VERTEX COORDINATES ARE (x = 500, y = 500)
THE TOP RIGHT VERTEX COORDINATES ARE (x = 900, y = 1000)
THE ROTATION CODE IS 2

```
ACORE : 1000 2000
ACORE
ACORE_BUFFER

BCORE : 3000 5000 3500 6000
BCORE

BLOCK 1 : 4000 1000
CCORE. BLOCK 1

BLOCK 2 : 5000 2000
CCORE. BLOCK 2

MACRO : 500 500 900 1000 2
MEMORY
```

FIG. 6

ROTATION CODE
- 0: NO ROTATION
- 2: ROTATION OF 90 DEGREES IN THE LEFT DIRECTION
- 4: ROTATION OF 180 DEGREES
- 6: ROTATION OF 90 DEGREES IN THE RIGHT DIRECTION
- 12: MIRROR-IMAGING AROUND THE x-DIRECTION
- 8: MIRROR-IMAGING AROUND THE y-DIRECTION
- 10: MIRROR-IMAGING AROUND THE x-DIRECTION FOLLOWED BY ROTATION OF 90 DEGREES IN THE LEFT DIRECTION
- 14: MIRROR-IMAGING AROUND THE x-DIRECTION FOLLOWED BY ROTATION OF 90 DEGREES IN THE RIGHT DIRECTION

FIG. 7

| NAME OF BLOCK | NAME OF PIN | x-COORDINATE AND y-COORDINATE | |
|---|---|---|---|
| MEMORY 1 | A0 | 100 | 0 |
| MEMORY 1 | A1 | 200 | 0 |
| MEMORY 1 | A2 | 300 | 0 |
| ⋮ | | | |
| MEMORY 2 | A0 | 0 | 100 |
| MEMORY 2 | A1 | 0 | 200 |

FIG. 14

```
           NAME OF   CAPACITANCE
           SIGNAL     VALUE
              |         |
    *  | NET DATAOUT_4 0.742980PE
       CONNECTION CONNECTION         NAME CAPACITANCE    y-COORDINATE
          NODE      POINT            OF PIN  VALUE              |
                                     IN/OUT         x-COORDINATE|
                                        |            |          |
    *  | (LITE_255.M10 : A LITE_255.M10  A  | 0.013360PF -197917 -750000)
    ** | (LITE_255.M4 : A LITE_255.M4    A  | 0.044753PF -197917 -750000)
    ***| (SAM_HOS_TOP.HOS.HS.HSDAT_reg_4_:Q SAM_HOS_TOP.HOS.HS.HSDAT_reg_4_Q  O  0.000000PF -190740 -328505)
    Cg1_30  N138_281_5   0 8.700e-15
    Cg2_30  N138_282_127 0 9.744e-14
    Cg3_30  N138_282_155 0 9.744e-14
    Cg4_30  N138_282_183 0 9.744e-14
    Cg5_30  N138_282_211 0 5.923e-14
    Cg6_30  N138_282_37  0 9.744e-14
    Cg7_30  N138_282_65  0 9.744e-14
    Cg8_30  N138_282_9   0 5.742e-14
    Cg9_30  N138_282_93  0 5.916e-14
    Cg10_30 N138_282_99  5 0 9.916e-14
    Cg11_30 SAM_HOS_TOP.HOS.HS.HSDAT_reg_4_:Q 0 1.211e-14
    R1_30   LITE_255.M10:A N138_281_5 0.100
    R2_30   LITE_255.M4:A  N138_281_5 0.100
    R3_30   SAM_HOS_TOP.HOS.HS.HSDAT_reg_4_:Q N138_282_211 16.300        <===WIRE RESISTANCE VALUE
    R4_30   N138_282_211 N138_282_183 75.600
    R5_30   N138_282_183 N138_282_155 75.600
    R6_30   N138_282_155 N138_282_127 75.600
    R7_30   N138_282_127 N138_282_99  75.600
    R8_30   N138_282_99  N138_282_93  16.200
    R9_30   N138_282_93  N138_282_65  75.600
    R10_30  N138_282_65  N138_282_37  75.600
    R11_30  N138_282_37  N138_282_9   75.600
    R12_30  N138_282_9   N138_281_5   13.500
```
                                                                        <===WIRE RESISTANCE VALUE

METHOD AND COMPUTER PROGRAM PRODUCT FOR ESTIMATING WIRE LOADS

CROSS-REFERENCE TO RELATED APPLICATIONS

This application is based upon and claims the benefit of priority from the prior Japanese Patent Application Nos. 11-371859, filed Dec. 27, 1999 and 2000-196811, filed Jun. 29, 2000; the entire contents of which are incorporated herein by reference.

BACKGROUND OF THE INVENTION

1. Field of the Invention

The present invention is related to a wire load estimating method and a wire load estimating computer program product for estimating wire loads between instances such as cells, macro blocks and synthesized blocks and a repeater cell inserting method and a repeater cell inserting computer program product for determining the location of a repeater cell to be inserted on a long wire.

2. Description of the Related Art

Along with the advent of the miniaturization of LSIs, the signal delay originating from wiring delays, rather than originating from gate delays, become a serious problem. Because of this, it is significantly important to estimate wire loads (the wire resistance and the wire capacitance) with a higher degree of accuracy for the purpose of executing logic simulation, timing simulation and so forth.

In accordance with a conventional technique, the wire resistance values and the wire capacitance values are calculated in accordance with the following procedures.

(Procedure 1-1) A netlist is input to a place and route tool, followed by automatically routing and placing parts and wires.

(Procedure 1-2) The number of connection points, the wire capacitance value and the wire resistance value are obtained for each net by the use of the layout as generated.

(Procedure 1-3) The numbers of connection points, the wire capacitance values and the wire resistance values are statistically processed in order to calculate the wire capacitance value and the wire resistance value corresponding to each of the numbers of connection points. The result is stored in the storage area of a computer system in the form of a table.

These preliminary procedures are repeated for generating a table of the wire capacitance value and the wire resistance value corresponding to each of the numbers of connection points in accordance with the above procedures 1-1 to 1-3.

FIG. 1 is one example of such tables. The wire capacitance value and the wire resistance value of each net are calculated with reference to these tables.

(Procedure 2-1) The information about the number of connection points for each net is obtained by the use of the netlist. (Procedure 2-2) In usual cases, the netlist is hierarchically described so that the netlist is flattened in advance of calculating the information about the numbers of connection points.

(Procedure 2-1) The wire capacitance value and the wire resistance value of each net are calculated with reference to the above table on the basis of the information about the number of connection points as calculated.

The number of connection points, the wire capacitance value and the wire resistance value are obtained for each net of the netlist in accordance with the above procedures 2-1 to 2-2.

In the case that a wire is eventually extended for a long length, a repeater cell must be inserted thereto.

As illustrated in FIG. 2, in accordance with the method of the prior art technique, cells are placed in the step S312 after reading the netlist 10; a detailed routing process is conducted in the step S314 for outputting the wire capacitance values and the wire resistance values 316; a repeater cell(s) is inserted with reference to the netlist 10, the wire capacitance value and the wire resistance value in the step S318 followed by outputting a netlist 320 with a repeater cell(s); the differential layout is obtained by comparing the netlist 320 with a repeater cell(s) and the original netlist 10 in the step S322; cells are re-placed with fine adjustment of the cell locations in the periphery in accordance with the differential layout in the step S324; the wiring layout is re-routed in the step S326; the sizes of gates are adjusted in accordance with the wire loads which are modified after re-routing the wiring layout in the step S328; and the cells are re-placed and re-routed in accordance with the netlist after changing the sizes of gates in the step S330 in the course of the Engineering Change Order (ECO) process in order to output a layout 332.

The operation of the prior art technique is as follows. First, the placement of cells and the detailed routing process are conducted by means of an automatic place and route tool in order to output the wire capacitance values and the wire resistance values. A repeater cell is inserted to the path of a signal accompanied with a large capacitance with reference to the wire capacitance values as obtained. Re-placement of the cells and the re-routing of connection points is then conducted with respect to only the modified areas which are determined by comparing the netlist after inserting a repeater cell(s) and the original netlist before inserting a repeater cell(s). The re-placement of the cells and the re-routing of connection points is conducted in order to retain as much as possible of the original layout before inserting a repeater cell(s). The layout of cells and the re-routing of connection points are then adjusted after changing the sizes of gates in accordance with a usual process of circuit design, followed by outputting an adjusted layout.

SUMMARY OF THE INVENTION

In the case of the prior art technique, the wire capacitance value and the wire resistance value of each net are estimated only with reference to the above described tables, i.e., with reference to the number of connection points of each net, without taking into consideration the wire length of each net. Because of this, in the case of a net which has a fewer number of connection points and a long wire length, the wire capacitance value and the wire resistance value of the net tend to be underestimated as compared with the actual values. Contrary to this, in the case of a net which has many connection points and a short wire length, the wire capacitance value and the wire resistance value of the net tend to be overestimated as compared with the actual values. This is because the wire capacitance value and the wire resistance value are estimated only with reference to the number of connection points of each net, without taking into consideration the actual wire length of each net.

It is an object of the present invention to provide a method for estimating wire loads and a computer program product for estimating wire loads in which the accuracy of estimation is improved by estimating wire loads while taking into consideration wire lengths, which are represented by values close to the actual wire lengths.

In accordance with a feature of the present invention, a wire load is estimated by (1) reading a netlist; (2) generating connection information including the names of signals, the identification names and the names of pins of instances which include cells, macro blocks and synthesized blocks as described in said netlist; (3) dividing an area of a chip into two or more regions and determining connection point coordinates for each of said regions by the use of said connection information and locations of said instances as placed; (4) determining a wiring path by the use of said connection point coordinates; and (5) estimating a wire capacitance value and a wire resistance value with reference to said wiring path.

Each instance is placed into each region. Connection point coordinates of each region are treated as connection point coordinates of each instance to perform global routing. The wire capacitance value and the wire resistance value between each region can be estimated on the basis of the global routing.

Also, in accordance with the prior art technique making use of a repeater cell, the cell placement and the detailed routing process are conducted in advance with the netlist including no repeater cell in the steps S312 and S314 as illustrated in FIG. 2. Because of this, the size of the netlist 320 to which repeater cells are inserted becomes significantly large as compared with the netlist 10 without repeater cells so that it is difficult to perform re-placement of cells in the step S324 and to retain the original floor plan. In some cases, therefore, it is required to generate another floor plan again.

Also, since repeater cells are inserted in the step S318 after the detailed routing process is performed without repeater cells in the step S314, a repeater cell may be inserted to a detour which would be formed in the detailed routing process. This unnecessary repeater as inserted serves to increase the delay time of signal transmission.

It is another object of the present invention to provide a method for inserting a repeater cell and a computer program product for inserting a repeater cell in which it is possible to reduce the amount of increase of the netlist for the final layout and to reduce the number of detouring routes for a long wire which would possibly be a critical path.

In accordance with a further feature of the present invention, cells are placed by performing the global routing process among instances by the use of a netlist and a global floor plan indicative of the coordinates of regions and macro blocks, inserting temporary repeater cells to said netlist on the basis of the wire capacitance values and the wire resistance values which are obtained as a result of said global routing process and placing the cells on the basis of the result of inserting the temporary repeater cells.

The wire capacitance values and the wire resistance values are calculated on the basis of the global routing process and used to temporarily insert the repeater cell in order to reduce the increment in the size of the netlist for the final layout. Accordingly, it is possible to generate a final layout without substantially modifying the original floor plan.

In accordance with a further feature of the present invention, cells are re-placed by placing instances, ideally routing each wire without taking into consideration a necessary roundabout route to avoid other wires, inserting repeater cells on the basis of the wire capacitance and resistance values corresponding to the result of the ideally routing, and re-placing the cells with reference to the locations of the repeater cells as inserted.

It is possible to perform routing up front a long wire, which would possibly be a critical path, with few detouring routes in a nearly ideal manner by determining the locations of the repeater cells to be inserted on the basis of the ideal routing and determining the wiring paths in accordance with the location of the repeater cells as inserted.

BRIEF DESCRIPTION OF THE DRAWINGS

FIG. 1 is a partial view showing an exemplary table in which are described the wire capacitance value and the wire resistance value corresponding to each of the numbers of connection points in accordance with a prior art technique.

FIG. 5 is a view showing an exemplary block coordinate file 16a in accordance with the embodiment of the present invention.

FIG. 6 shows one exemplary set of the rotation codes for use in the block coordinate file of FIG. 5.

FIG. 7 is a view showing an exemplary macro block pin coordinate file 16b in accordance with the embodiment of the present invention.

FIG. 14 is a view showing wiring information as output from the output unit 42 as illustrated in FIG. 3.

DETAILED DESCRIPTION OF THE PREFERRED EMBODIMENTS

Herein below, several preferred embodiments in accordance with the present invention will be explained in conjunction with the accompanied drawings. In the following description accompanied with the drawings, like reference numbers indicate identical or similar elements.

[The First Embodiment]

Figure 2:
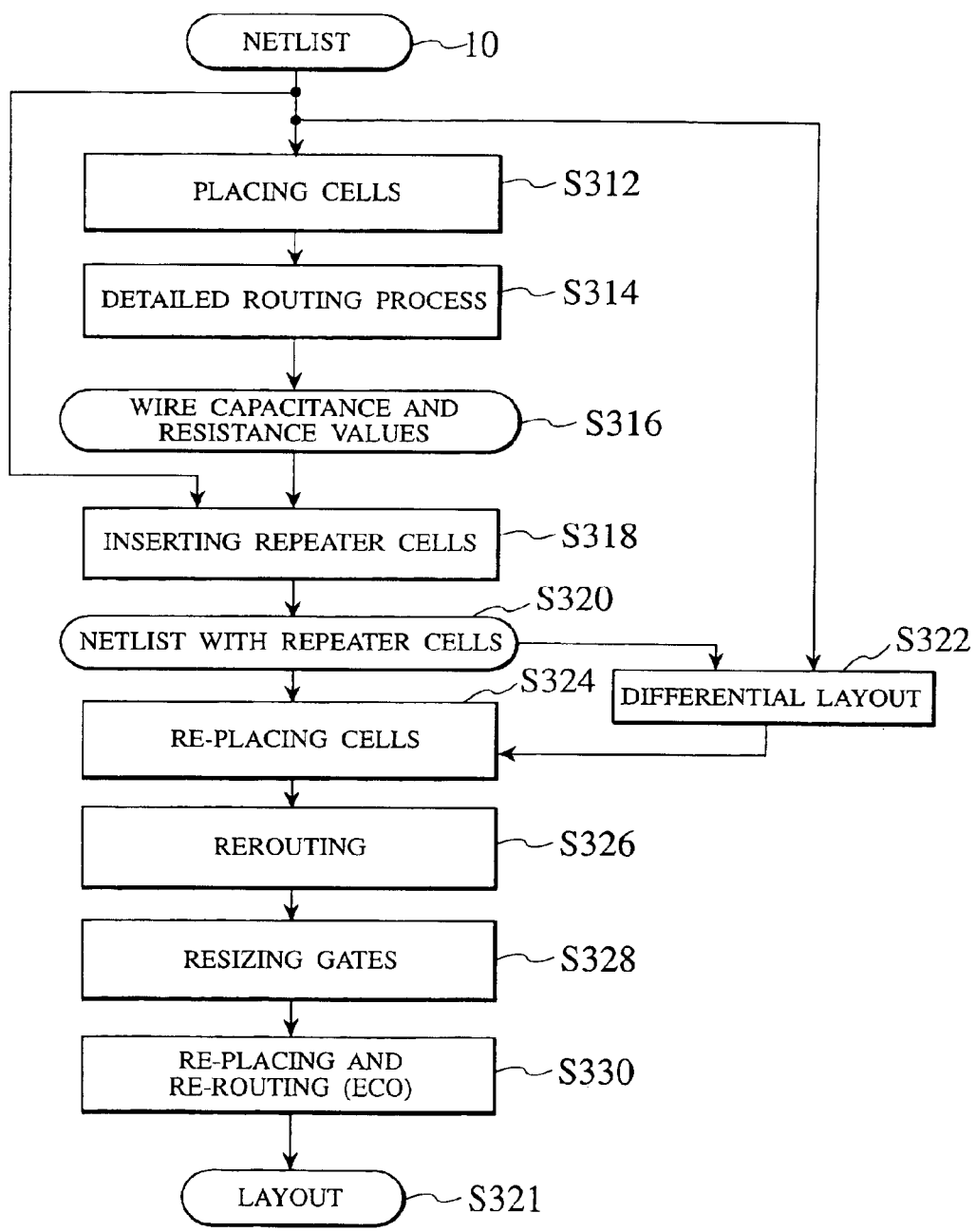
FIG. 2 is a flowchart showing the procedure of a prior art method of inserting repeater cells.
Figure 3:
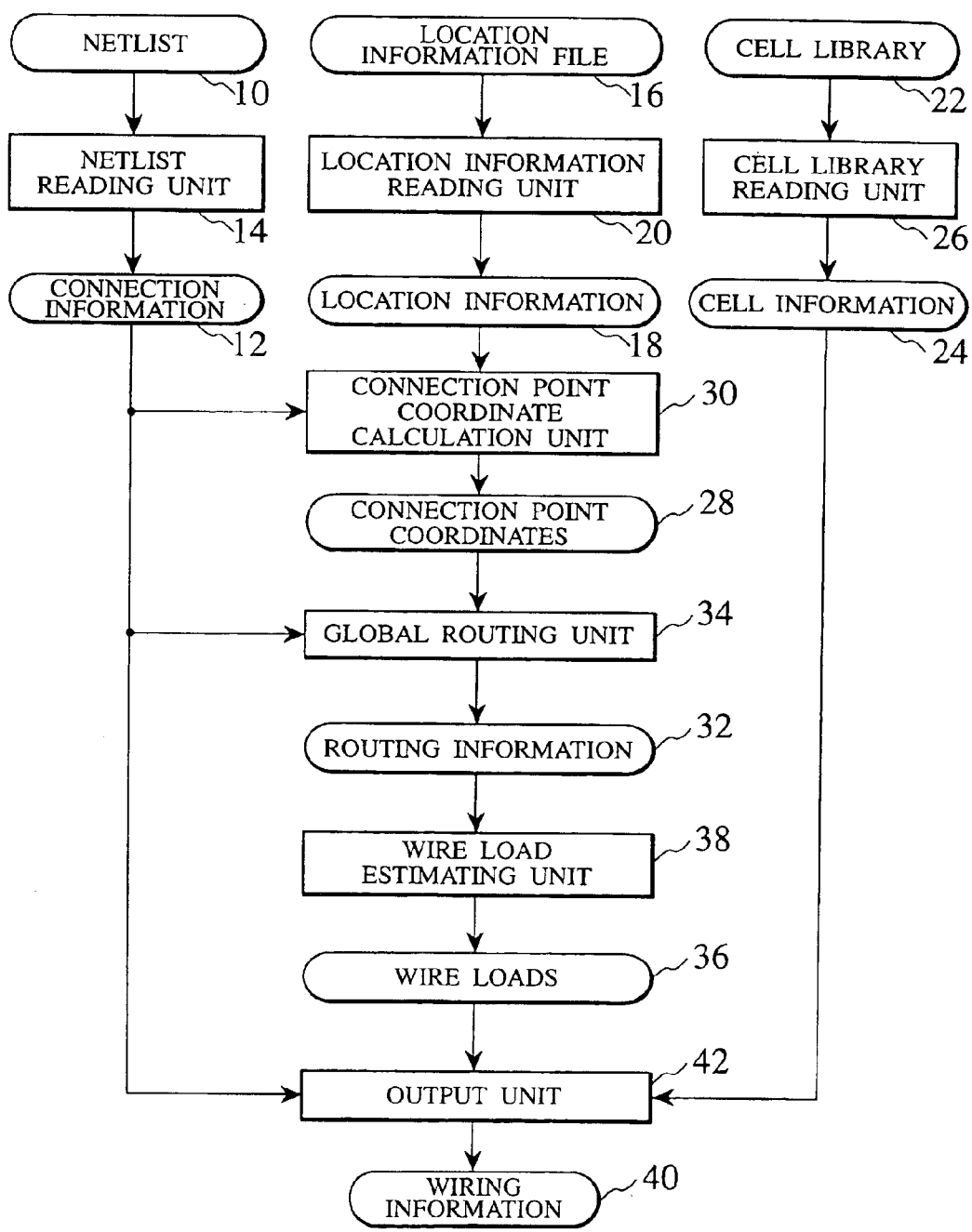
FIG. 3 is a diagram showing the configuration of the wire load estimating system in accordance with an embodiment of the present invention.

As illustrated in FIG. 3, the wire load estimating system in accordance with a first embodiment of the present invention is composed at least of a netlist reading unit 14, a location information reading unit 20, a cell library reading unit 26, a connection point coordinate calculation unit 30, a global routing unit 34, a wire load estimating unit 38 and an output unit 42.

The netlist reading unit 14 serves to read the netlist 10 in order to generate connection information 12 including at least the names of signals, the identification names of instances and the names of terminals, which are described in the netlist.

The "instances" includes cells, macro blocks and synthesized blocks. A cell is a unit consisting of a relatively simple circuit, with which a LSI circuit is designed A macro block is a relatively complicated cell such as a memory, an ALU, a multiplexer or the like. The synthesized block is composed of a combination of several cells.

The location information reading unit 20 serves to read a location information file 16 in order to generate location information 18 including the locations of the respective instances and the center coordinates of the regions in which the respective instances are placed.

The cell library reading unit 26 serves to receive a cell library 22 in order to generate cell information 24.

The connection point coordinate calculation unit 30 serves to read the connection information 12 and the location information 18 in order to calculate connection point coordinates 28. More specifically speaking, (1) two instances to be connected are determined; (2) the regions in which the respective instances are placed are determined; and (3) the coordinates of the connection points in the respective regions is calculated. In the case that a cell "a" and a cell "b" are connected, as one example, the region "A" to which the cell "a" belongs and the region "B" to which the cell "b" belongs are determined followed by calculating the coordinates of the center position of the region "A" and the center position of the region B.

The global routing unit 34 receives the connection information 12 and the connection point coordinates 28 in order to generate routing information 32. In the case that the center positions of the above described regions A and B are the connection points, these center positions are connected by a wire. This routing process is called as "the global routing" for the following reason. Namely, this is because connection is made between the center position of the region "A" and the center position of the region B, which are roughly regarded as the connection points, rather than between the actual connection points of the cell "a" and the cell "b".

The wire load estimating unit 38 serves to receive the routing information 32 and output wire loads 36. The output unit 42 serves to receive the connection information 12 and the cell information 24 and output wiring information. In the following description, these units will be specifically explained respectively.

(A) The Netlist Reading Unit 14

The netlist (netlist file) 10 is used to describe the connection relationship among the circuit elements constituting the integrated circuit under estimation or part thereof. In usual cases, the netlist 10 is hierarchically described for the purpose of, for example, compacting the data size thereof. The netlist reading unit 14 serves to read the netlist 10 as given and obtain the connection information 12 of the integrated circuit under estimation by the use of the connection relationship as described in the netlist 10. The connection information 12 includes (a) the names of signals, (b) the identification names of instances and (c) the names of pins of the respective instances. More specifically speaking, the netlist reading unit 14 performs, at the outset, flattening of the netlist 10 having a hierarchical structure. The respective nets are searched from the upper layer of the hierarchical structure in order to generate a table indicative of (a) the names of signals, (b) the identification names of instances and (c) the names of pins of the respective instances.

Figure 4:
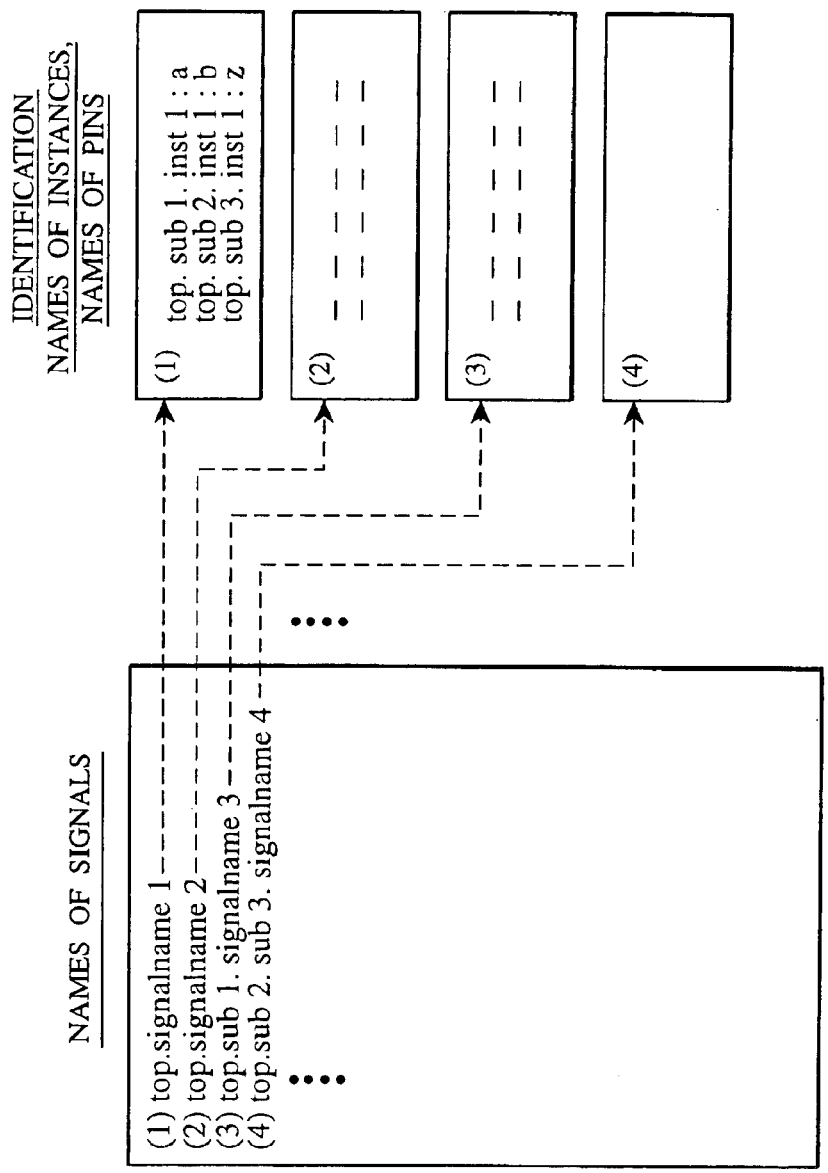
FIG. 4 is a view showing an exemplary table as generated by the netlist reading unit 14 shown in FIG. 3, the exemplary table containing (a) the names of signals, (b) the identification names of instances and (c) the names of pins of the respective instances.

In the case of the connection information table as illustrated in FIG. 4, the name of each signal is given a name indicative of the position of said each signal in the hierarchical structure. For example, "top.signalname1" indicates a signal which is located in the position below the "top" layer and given the name of "signalname1". Also, in the same manner, "top.sub1.signalname3" indicates a signal which is located in the position below the "sub1" layer, which is in turn located in the position below the "top" layer, and given as the name of "siganalname3". On the other hand, the signal "signalname1" is connected, for example, to an instance which is located in the position below the "sub1" layer, which is in turn located in the position below the "top" layer, and given the name of "inst1", an instance which is located in the position below the "sub2" layer, which is in turn located in the position below the "top" layer, and given the name of "inst2", and an instance which is located in the position below the "sub3" layer, which is in turn located in the position below the "top" layer, and given the name of "inst3". Furthermore, it is indicated that the names of the pins of the respective instances connected to the signal "signalname1" are "a", "b" and "z" respectively. In usual cases, the connection information table as generated by the netlist reading unit 14 is described in order that the names of signals, the identification names of the respective instances and the names of the pins of the respective instances are interrelated in a connection relationship. In the case of the example as illustrated in FIG. 4, the names of the respective signals are accompanied with pointers to the locations in the table of the identification names and the names of the pins of the instances to which the respective signals are connected.

(B) The Cell Library Reading Unit 26

The cell library 22 consists of a database in which a number of instances such as cells, macro blocks are registered. The database usually includes the layout data, the simulation data and so forth of the respective instances. The cell library reading unit 26 serves to read the cell library 22 in order to obtain the cell information 24 including (a) the names of the respective instances, (b) the names of the pins belonging to the respective instances, (c) the properties of the respective pins belonging to the respective instances (i.e., the properties indicative of an input pin or an output pin), and (d) the capacitance value of the respective input pins belonging to the respective instances. The cell library reading unit 26 then generates the cell information table 24 indicative of the cell information 24 as obtained. Meanwhile, the cell library 22 can be used in this case as long as it includes at least the pin information and the timing information of the respective cells for example for use in logical synthesis.

(C) The Location Information Reading Unit 20

Figure 9:
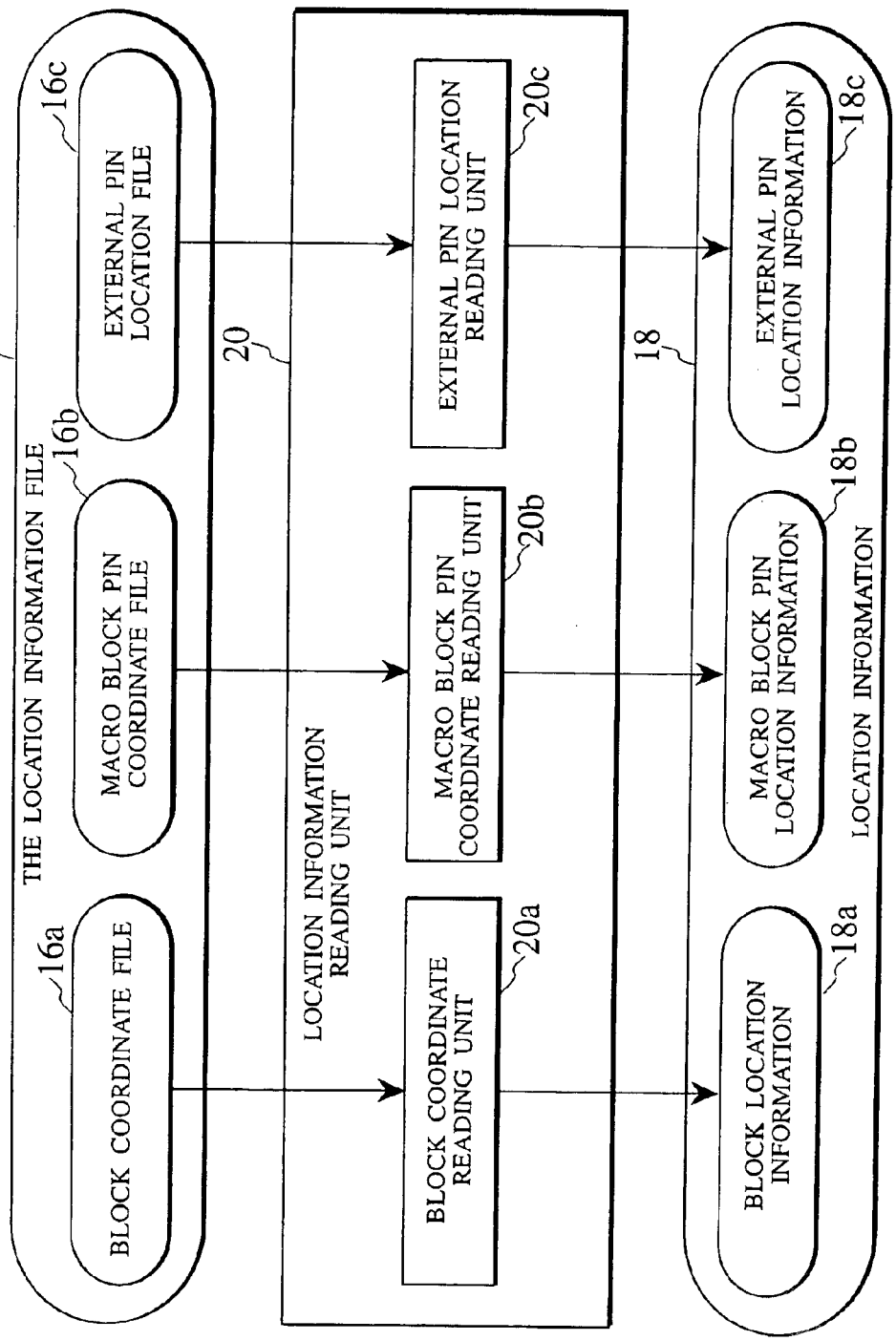
FIG. 9 is a block diagram showing the configuration of the location information reading unit 20 as illustrated in FIG. 3.

The location information file 16 for use in the location information reading unit 20 is composed of a block coordinate file 16a, a macro block pin coordinate file 16b and a external pin location file 16c as illustrated in FIG. 9.

The block coordinate file 16a serves to provide the coordinates of the respective instances such as cells, macro blocks and synthesized blocks each of which is composed of a combination of several cells as illustrated in FIG. 5. The coordinates are given for example as (a) the center coordinates of the respective instances, (b) the top right vertex coordinate and the bottom left vertex coordinate of the respective instances, (c) the rotation codes of the respective instances together with the top right vertex coordinate and the bottom left vertex coordinate thereof and so forth.

In the case of the example as illustrated in FIG. 5, the instances "ACORE" and "ACORE_BUFFER" are given the center coordinates thereof. Also, the instance "BCORE" is given the top right and the vertex coordinates thereof. Furthermore, the instance "MACRO" is given a rotation code together with the top right and the vertex coordinates thereof. FIG. 6 shows one exemplary set of the rotation codes for use in FIG. 5.

As illustrated in FIG. 7, the macro block pin coordinate file 16b contains (a) the names of the respective macro block, (b) the names of the pins of the respective macro block, and (c) the coordinates of the respective pins. In this case, the coordinates of each pin as given are the x-coordinate and the y-coordinate with the origin as being set at the bottom left vertex of the macro block including said each pin.

Figure 8:
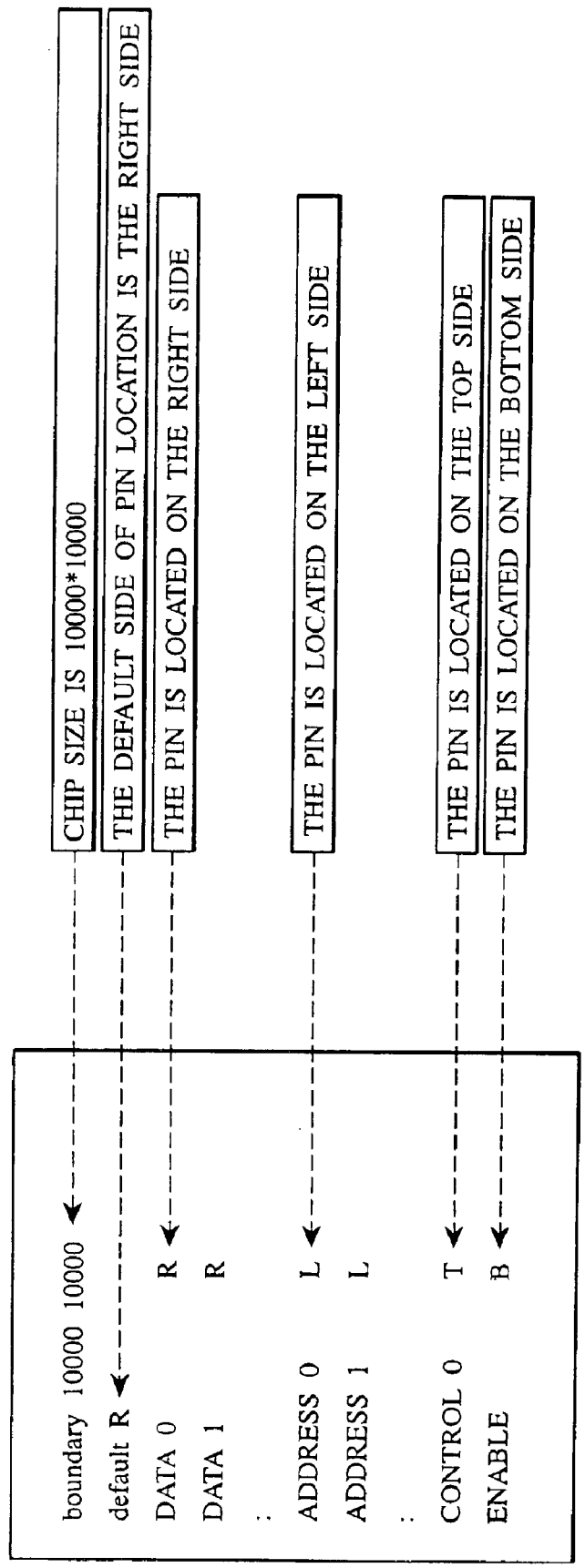
FIG. 8 is a view showing an exemplary external pin location file 16c in accordance with the embodiment of the present invention.

As illustrated in FIG. 8, the external pin location file 16c contains the size of the chip and the sides of the chip on which the respective external pins are located. In the case of the example as illustrated in FIG. 8, there is described a chip size of 10000×10000 and correspondence of the respective external pins and the locations thereof. Also, there is described an entry, "default", as "R" which is indicative that the external pins which are not described are located at the right side.

As illustrated in FIG. 9, the location information reading unit 20 is composed of a block coordinate reading unit 20a for receiving the above described block coordinate file 16a and outputting block location information 18a, a macro block pin coordinate reading unit 20b for receiving the macro block pin coordinate file 16b and outputting macro block pin location information 18b, an external pin location reading unit 20c for receiving the external pin location file 16c and outputting external pin location information 18c.

The block coordinate reading unit 20a serves to read the block coordinate file 16a in order to obtain the coordinates (the center coordinates, the origin coordinates, the vertex coordinates and so forth), the sizes, the rotation codes and the like of the respective instances such as cells, macro blocks and synthesized blocks. The block coordinate reading unit 20a then serves to generate a table indicative of the information as obtained as described above.

The macro block pin coordinate reading unit 20b serves to read the macro block pin coordinate file 16b in order to obtain the pin coordinates of the respective macro blocks. Namely, the macro block pin coordinate reading unit 20b serves to obtain the displacements of the locations of the respective pins from the origin of the macro block. Meanwhile, in this case, the pin coordinates are given as the x-coordinate and the y-coordinate with the origin as set at the bottom left vertex of each of the respective macro blocks. The macro block pin coordinate reading unit 20b serves to generate a table indicative of the pin coordinates as obtained.

The external pin location reading unit 20c serves to read the external pin location file 16c in order to obtain the locations of the respective external pins and the chip size. A table is then generated in order to provide the information as obtained as described above.

(D) The Connection Point Coordinates Calculation Unit 30

Figure 10:
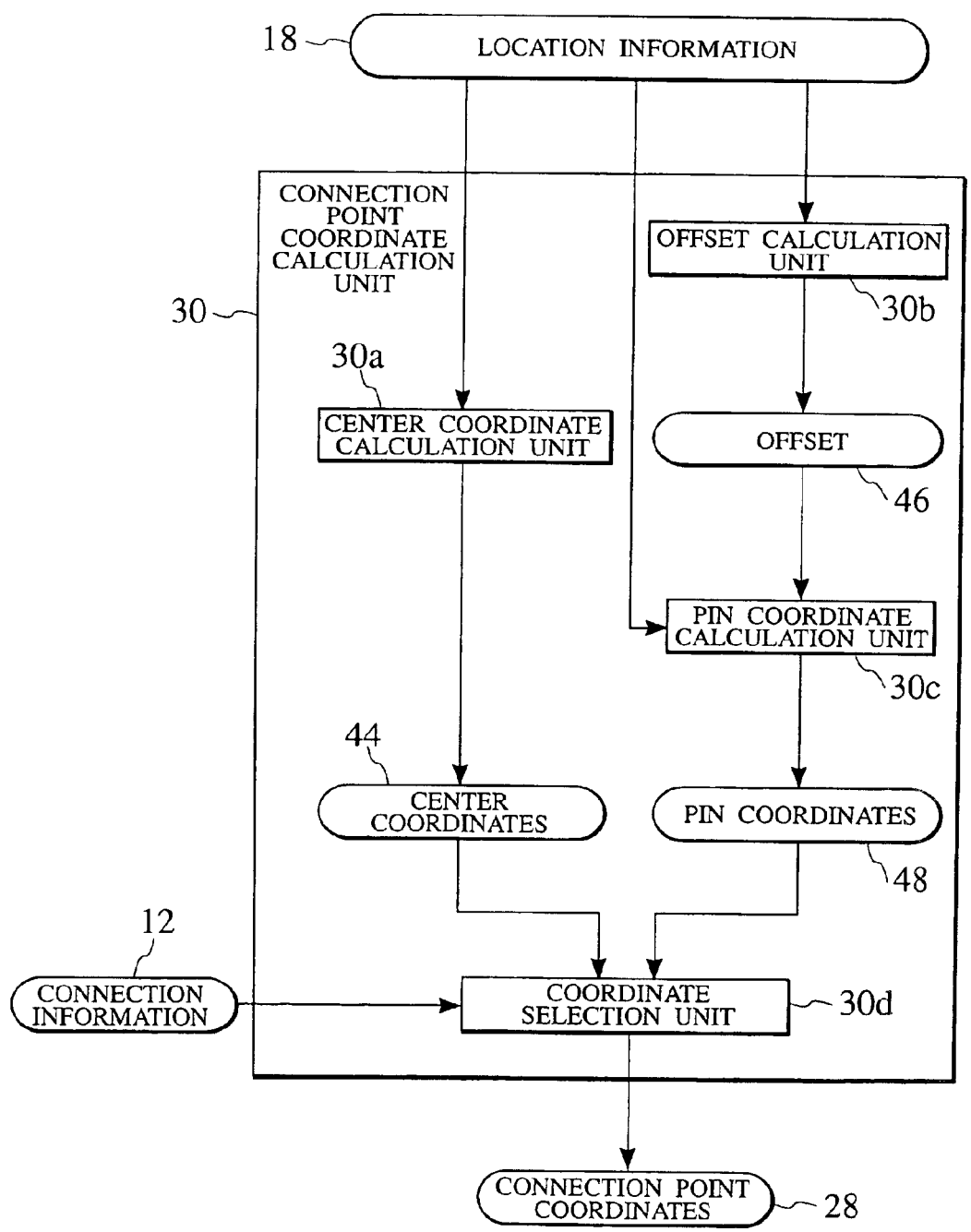
FIG. 10 is a block diagram showing the configuration of the connection point coordinate calculation unit 30 as illustrated in FIG. 3.

As illustrated in FIG. 10, the connection point coordinate calculation unit 30 is composed of a center coordinate calculation unit 30a, an offset calculation unit 30b, a pin coordinate calculation unit 30c and a coordinate selection unit 30d.

The center coordinate calculation unit 30a serves to obtain the coordinates of the respective instances such as cells, macro blocks and synthesized blocks with reference to the location information 18 and calculate the center coordinates 44 of the respective instances. The offset calculation unit 30b serves to obtain the pin coordinates and the rotation codes of the respective macro blocks with reference to the location information 18 and calculate the offsets 46 of the respective pins. The pin coordinate calculation unit 30c serves to obtain the coordinates of the respective macro blocks with reference to the offsets 46 and the location information 18 and calculate the pin coordinates 48 of the respective pins. The coordinate selection unit 30d serves to obtain the center coordinates 44, the pin coordinates 48 and the connection information 12 and calculate the connection point coordinates 28.

The center coordinate calculation unit 30a serves to obtain the coordinates of the respective instances (cells, macro blocks and synthesized blocks) with reference to the location information 18.

The area of the chip on which the respective instances are placed is divided into a plurality of regions. The center coordinates of the respective regions are then calculated. There may be a region including a plurality of cells and a region including only a single macro block.

Figure 15:
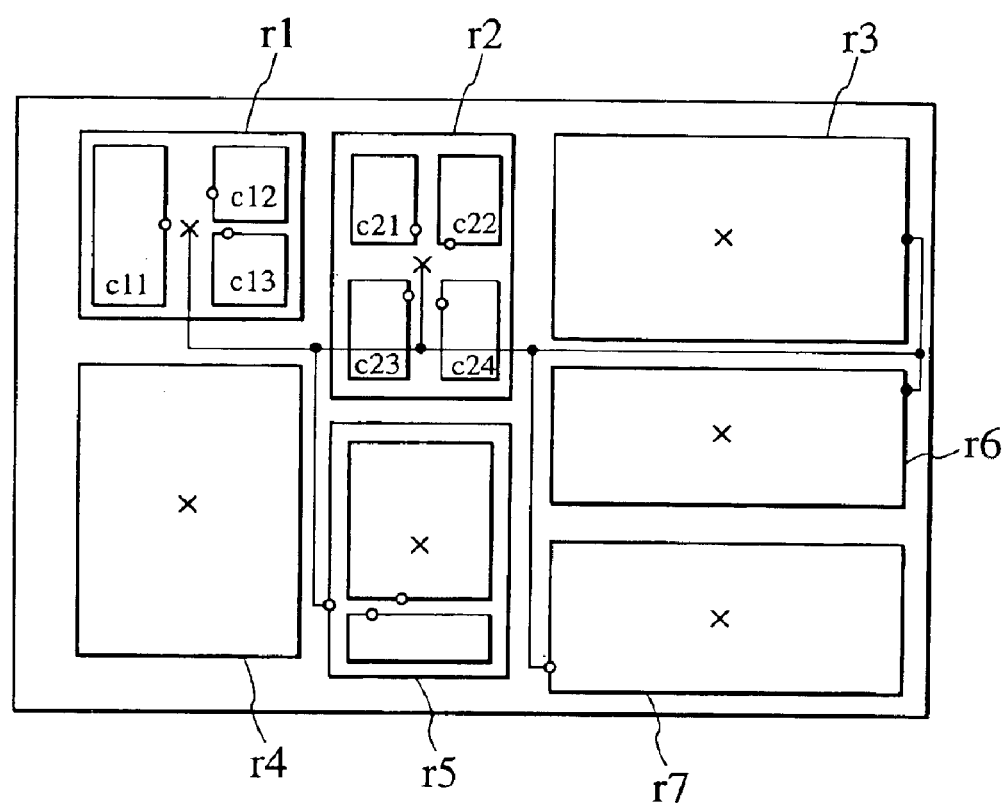
FIG. 15 is an explanatory view for showing the area of a chip divided into a plurality of regions r1 to r7, where each of the regions r1, r2 and r5 includes a plurality of cells respectively, and each of the regions r3, r4, r6 and r7 includes only a single macro block respectively.

The regions r1 and r2 as illustrated in FIG. 15 are examples of regions including a plurality of cells. On the other hand, the region r3 is an example including only a single macro block.

In the case of a region including only a single macro block, it is true that "the center position of the region=the center position of the macro block". However, in the case of a region including a plurality of cells, it is not always true that "the center position of the respective cell=the center position of the respective region".

In the case that the coordinates of a macro block are given as center coordinates, the coordinates as obtained can be used as the center coordinates 44 of the region. On the other hand, in the case that the bottom left and top right coordinates of a macro block are given, the mean value between the bottom left and top right coordinates as obtained is used as the center coordinates 44 of the region. The center coordinate calculation unit 30*a* then serves to generate a table in which the names of the respective regions and the center coordinates 44 as obtained are interrelated.

The offset calculation unit 30*b* serves to obtain the pin coordinates and the rotation codes of the respective macro blocks with reference to the location information 18. The offsets 46 of the respective pins are obtained on the basis of the pin coordinates and the rotation codes of the respective macro blocks as obtained as follows. In the following description, the pin coordinates of the respective macro blocks are designated as (Xin,Yin); the offsets of the respective pins as (Xout,Yout); and the origin as (0,0). Also, the rotation codes are such as illustrated in FIG. 6.

(a) In the case that the rotation code is "0", (Xout,Yout)=(Xin,Yin).

(b) In the case that the rotation code is "2", (Xout,Yout)=(0Yin,Xin).

(c) In the case that the rotation code is "4", (Xout,Yout)=(0-Xin,0-Yin).

(d) In the case that the rotation code is "6", (Xout,Yout)=(Yin, 0-Xin).

(e) In the case that the rotation code is "12", (Xout,Yout)=(Xin, 0-Yin).

(f) In the case that the rotation code is "8", (Xout,Yout)=(0-Xin,Yin).

(g) In the case that the rotation code is "10", (Xout,Yout)=(Yin,Xin)

(h) In the case that the rotation code is "14", (Xout,Yout)=(0-Yin, 0-Xin)

The pin coordinate calculation unit 30*c* serves to obtain the coordinates of the respective macro blocks with reference to the location information 18 together with the offsets 46 of the respective pins. The pin coordinates 48 of the respective pins are calculated by adding the offsets 46 of the respective pins to the coordinates of the origin of each macro block (the coordinates of the bottom left vertex in this case). The pin coordinate calculation unit 30*c* serves to generate a table in which are interrelated the names of the respective macro blocks and the names of the pins and the coordinates.

The regions r6 and r7 as illustrated in FIG. 15 are examples of regions, each of which includes a single macro block, where the positional relationship of the connection points of these macro blocks corresponds to a rotation of 180 degrees, i.e., as indicated by the rotation code "4".

The coordinate selection unit 30*d* serves to obtain the connection information 12 from the netlist reading unit 14 and calculate the coordinates of the respective connection points described in the connection information 12. The calculation is performed with reference to the table generated by means of the center coordinate calculation unit 30*a* and the pin coordinate calculation unit 30*c*. With respect to the coordinates of the respective pins described in the table of the pin coordinate calculation unit 30*c*, the coordinates in the table are used as they are while the center coordinates of the macro block are not used. Because of this, with respect to the pins of the respective macro blocks, the pins can be assigned to the connection points respectively. Also, with respect to other cells and synthesized blocks, the center coordinates of the respective regions are assigned to the connection points.

Furthermore, the connection point coordinate calculation unit 30 may be provided with an external pin coordinate generation unit in addition to the above described center coordinate calculation unit 30*a,* the offset calculation unit 30*b* the pin coordinate calculation unit 30*c* and the coordinate selection unit 30*d*.

Figure 11:
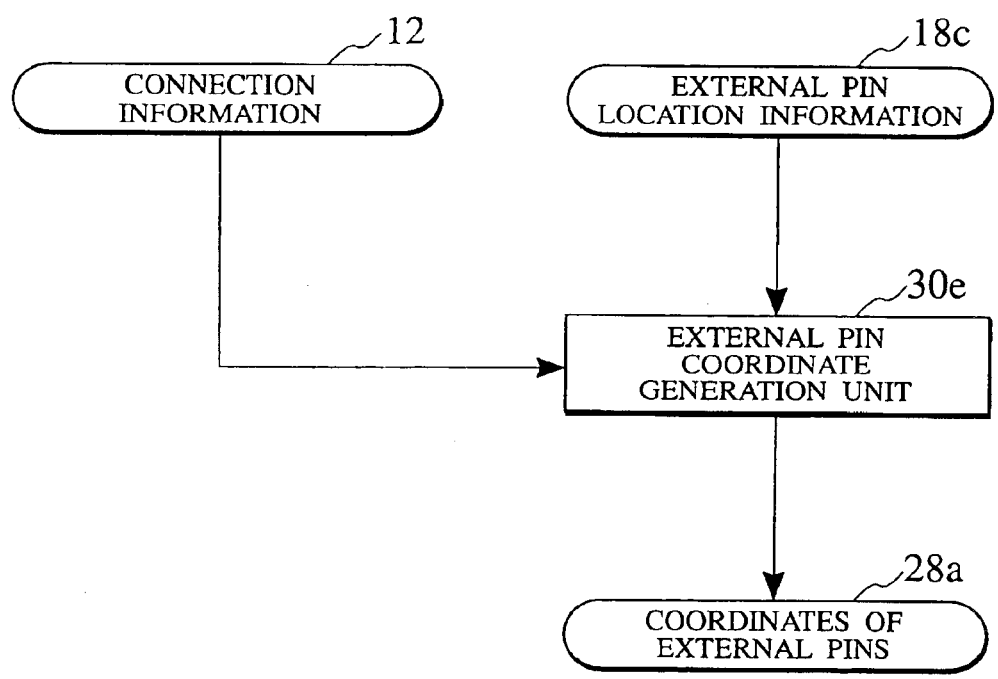
FIG. 11 is an explanatory view for showing the external pin coordinate generation unit 30e as part of the connection point coordinate calculation unit 30 as illustrated in FIG. 3.

As illustrated in FIG. 11, the external pin coordinate generation unit 30*e* serves to obtain the connection information 12 as output from the netlist reading unit 14 together with the external pin location information 18*c* as output from the external pin location reading unit 20*c*. The external pin coordinate generation unit 30*e* serves to select signals connected to external pins among from the respective signals described in the connection information 12 and serves to determine the sides on which is located each of the external pins which are connected to the signals as selected respectively with reference to the external pin location information 18*c*. The coordinates of the respective external pins are calculated as follows. In the following description, the pin coordinates of the respective external pins are designated as (x,y). Also, the origin (0,0) is set at the bottom left vertex of the region.

(a) In the case that an external pin is located on the left side of the region, (x,y)=(0, the average value of the y-coordinates of the connection points of the respective cells located within the region).

(b) In the case that an external pin is located on the right side of the region, (x,y)=(the width of the region, the average value of the y-coordinates of the connection points of the respective cells located within the region).

(c) In the case that an external pin is located on the top side of the region, (x,y)=(the average value of the y-coordinates of the connection points of the respective cells located within the region, the height of the region).

(d) In the case that an external pin is located on the bottom side of the region, (x,y)=(the average value of the x-coordinates of the connection points of the respective cells located within the region, 0).

The external pin coordinate generation unit 30*e* serves to add the coordinates 28*a* of the external pins as calculated to the table of the connection point coordinates 28.

The region r5 is an example in which an external pin is located on the left side of the region.

(E) THE GLOBAL ROUTING UNIT 34

The global routing unit 34 serves to perform the global routing among the respective connection points on the basis of the coordinates 28 of the connection points obtained by means of the connection point coordinate calculation unit 30 with reference to the connection information 12. The global routing unit 34 then outputs the result of the global routing as the routing information 32.

Figure 12:
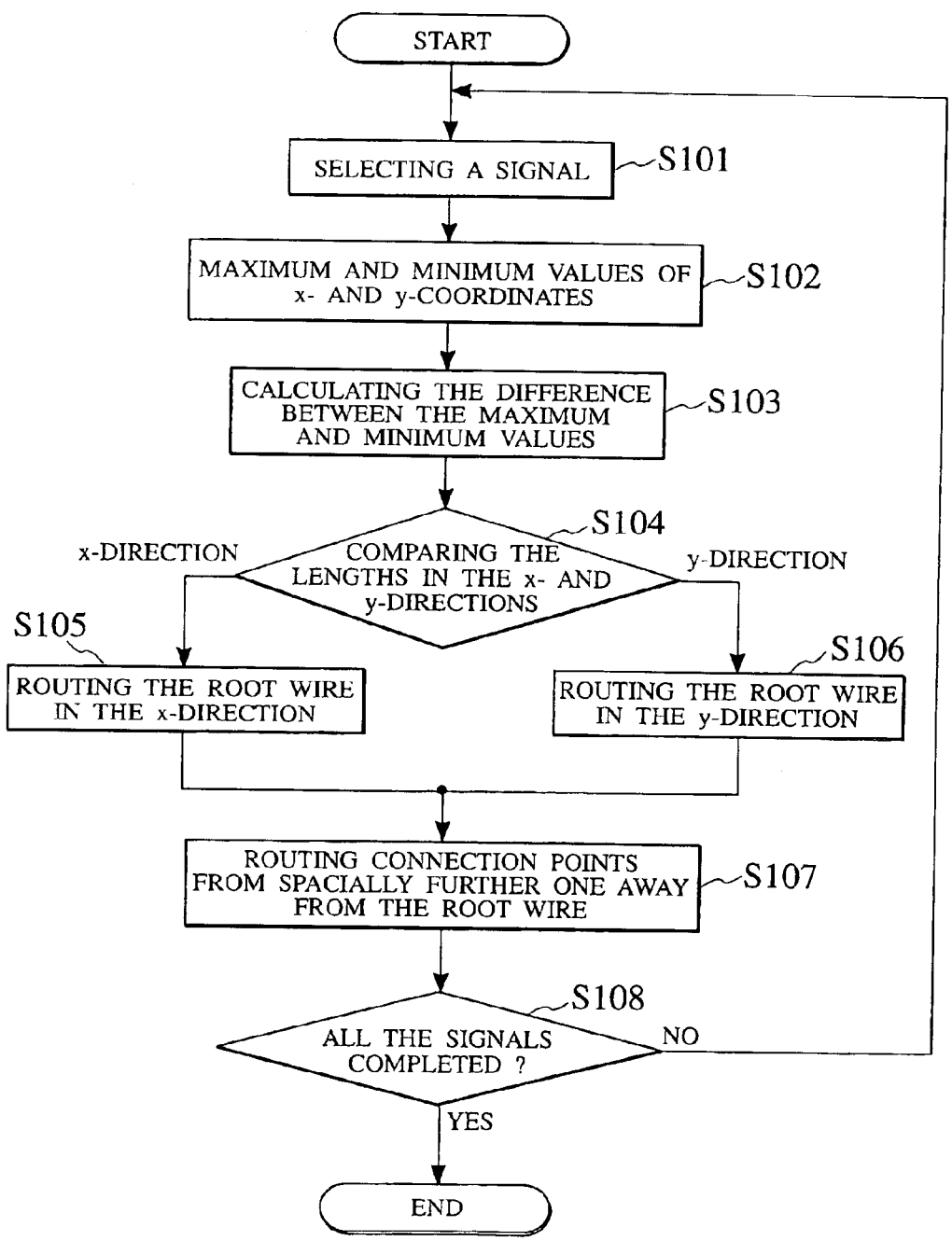
FIG. 12 is a flowchart showing the procedure of global routing by the global routing unit 34 as illustrated in FIG. 3.

As illustrated in FIG. 12, one signal is selected among from a plurality of signals described in the connection information 12 in the step S101 and calculate the maximum and minimum values of the x-coordinates and the maximum and minimum values of the y-coordinates respectively of each of the connection points which are connected to the signal as selected in the step S102. Then, the difference between the maximum value and the minimum value of the x-coordinates as well as those of the y-coordinates are calculated in the step S103 followed by comparing these differential values to determine which value is larger than the other in the step S104. Namely, with respect to a rectangular region interspersed with connection points are (see FIG. 13(*a*)), it is judged which side in the x-direction or the y-direction is longer.

Figure 13A:
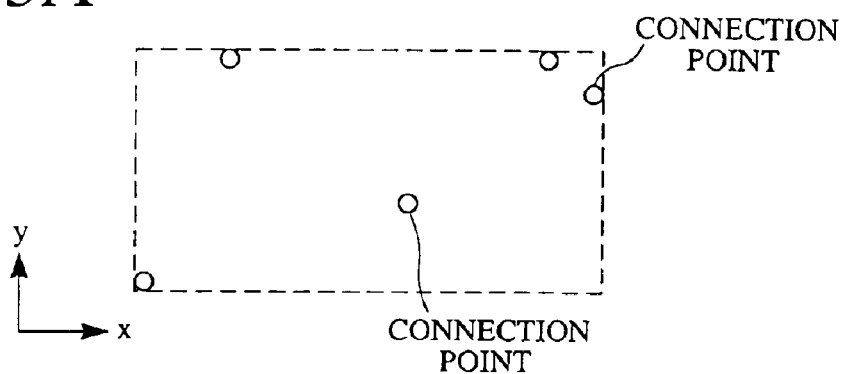
FIG. 13 is an explanatory view for showing the procedure of global routing by the global routing unit 34 as illustrated in FIG. 3.
Figure 13B:
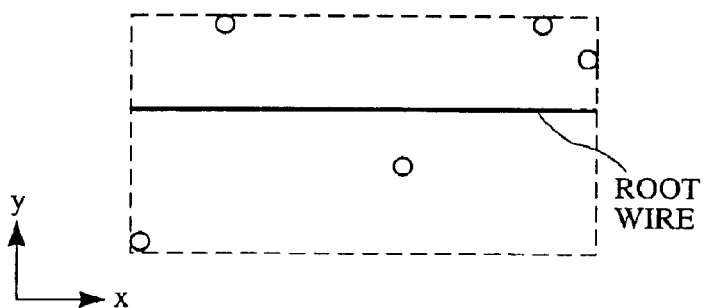

In the case that the side in the x-direction is longer (see FIG. 13(*b*)), a root wire is placed in order to extend through the rectangular region in the x-direction. The root wire extends from the minimum value of the x-coordinates of the connection points to the maximum value of the x-coordinates of the connection points. The y-coordinate of the root wire is fixed to the y-coordinate of the centroid of all the connection points in the step S105.

On the other hand, in the case that the side in the y-direction is longer, a root wire is placed in order to extend through the rectangular region in the y-direction. The root wire extends from the minimum value of the y-coordinates of the connection points to the maximum value of the y-coordinates of the connection points. The x-coordinate of the root wire is fixed to the x-coordinate of the centroid of all the connection points in the step S106.

Figure 13C:
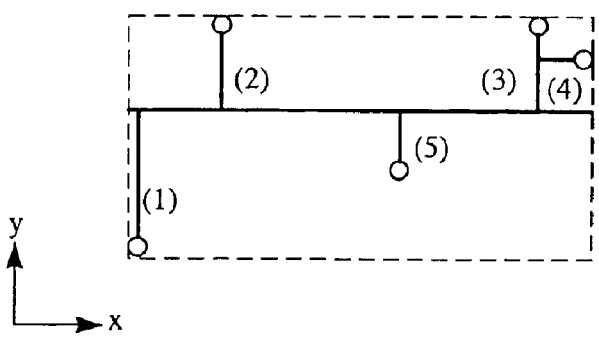

Next, the process of routing is conducted in sequence from the farthest connection point from the root wire (see FIG. 13(c)). More specifically speaking, in the first step, the process of routing is conducted in order to connect the root wire with the farthest connection point therefrom. Then, for the remaining connection points, the process of routing is conducted between each connection point and the wire closest to said each connection point in the step S107. "The closest wire" may be any one of the root wire and other wires between the root wire and the other connection points. If the process is not completed for all the signals in the step S108 (NO), the procedure is returned to the step S101. If the process is completed for all the signals in the step S108 (YES), the global routing process is terminated.

(F) The Wire Load Estimation Unit 38

The wire load estimating unit 38 serves to calculate the wire load 36 on the basis of the above described routing information 32. The wire load estimating unit 38 serves to save the wire load per unit length, i.e., the wire resistance value and the wire capacitance value per unit length and, on the basis of these values and the routing information 32, to calculate the wire resistance value and the wire capacitance value between each adjacent connection points.

(G) The Output Unit 42

The output unit 42 serves to obtain the wire loads 36, the connection information 12 and the cell information 24 which are calculated by means of the wire load estimating unit 38 and output them as interrelated information. More specifically speaking, the output unit 42 serves to output information about the names of the respective signals, the names of the respective connection points, the capacitance value of the respective connection points, the direction (input or output) of the respective connection points and the wire capacitance value and the wire resistance value between each adjacent connection points. These items of information are interrelated with each other. FIG. 14 shows one example of the wiring information 40 as output from the output unit 42.

The first embodiment of the present invention will be explained with respect to a flowchart.

Figure 16:
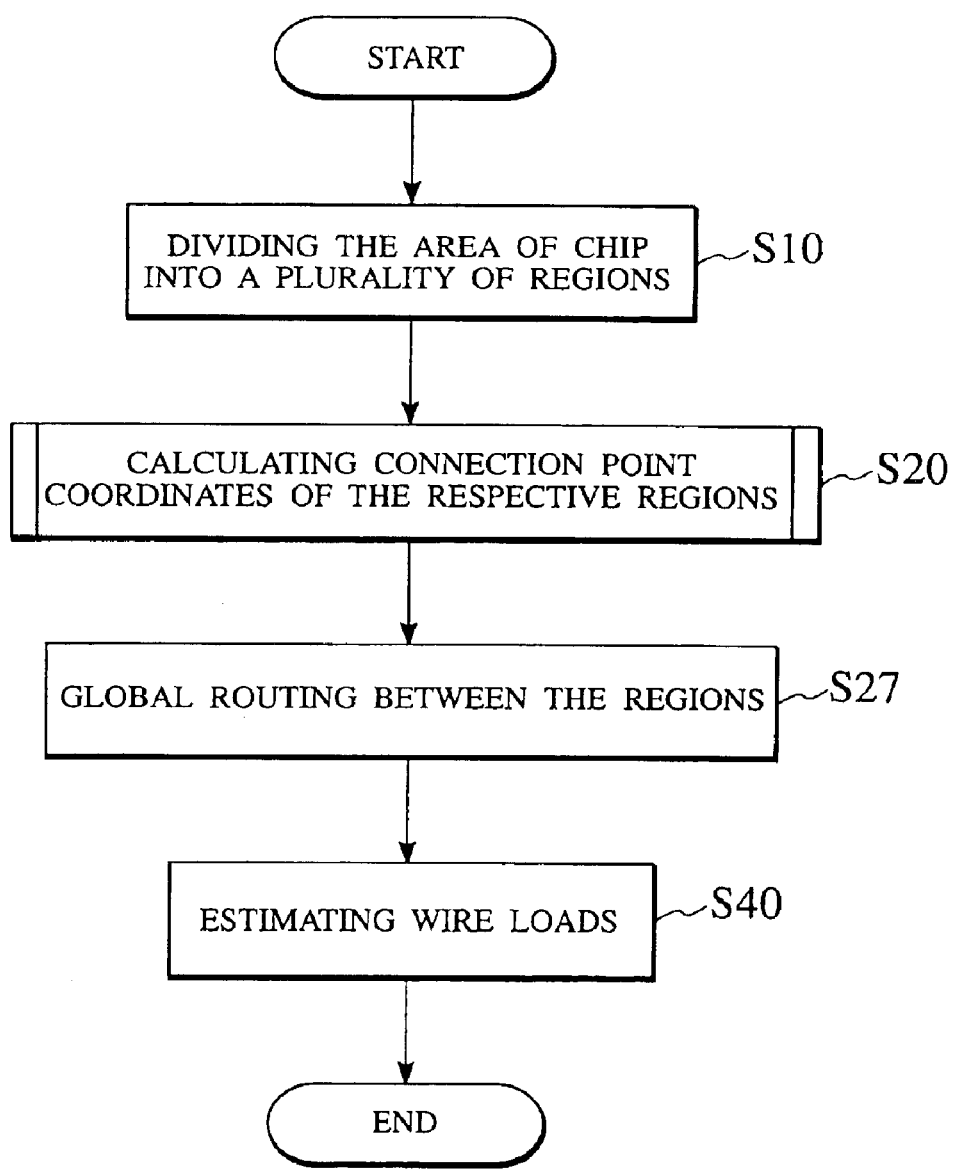
FIG. 16 is a flowchart showing the procedure of the wire load estimating method in accordance with a first embodiment of the present invention.

As illustrated in FIG. 16, in accordance with the first embodiment, the area of the chip is divided into a plurality of regions in the step S10. The connection point coordinates of the respective regions are then calculated in the step S20, followed by performing the global routing process between the regions. Finally, the wire loads are estimated in the step S40.

Each instance is divided into several regions each of whose connection point coordinates are treated as the coordinates of a connection point of said each instance to perform global routing. The wire capacitance value and the wire resistance value between each adjacent regions can be estimated on the basis of the global routing. When the process of routing is conducted after obtaining the respective connection points of respective cells (c11 to 13 and c21 to 24) which are located within the regions r1 and r2 as illustrated in FIG. 15, the wire capacitance values and the like as calculated on the basis of the result thereof are indicative that the wire capacitance values and the like estimated in accordance with the present embodiment have some errors, as a result of comparison with each other. However, the accuracy of the estimated values of the wire load is sufficiently improved as compared with the case making use of the table based upon statistical data as in accordance with the prior art technique.

It is possible to estimate the wire load only by determining the connection point coordinates of the respective regions in advance of placing cells, unlike the estimation of routing after the automatic placing process. For this reason, it is possible to perform the timing analysis with a high degree of accuracy at the initial stages of a designing procedure by taking into consideration the wire loads.

Figure 17A:
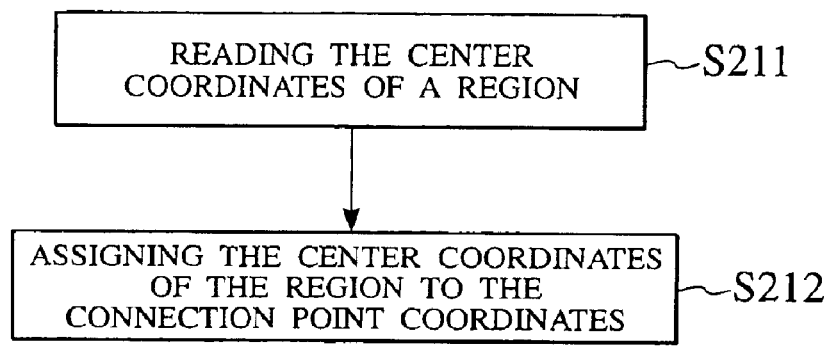
FIG. 17 is a flowchart showing the procedure of assigning the center coordinates of the respective regions to connection point coordinates.

In the case that the center coordinates of a region can be obtained as available coordinates of the region, as illustrated in FIG. 17A, the center coordinates are read in the step S211 and assigned to the connection point coordinates in the step S212.

Figure 17B:
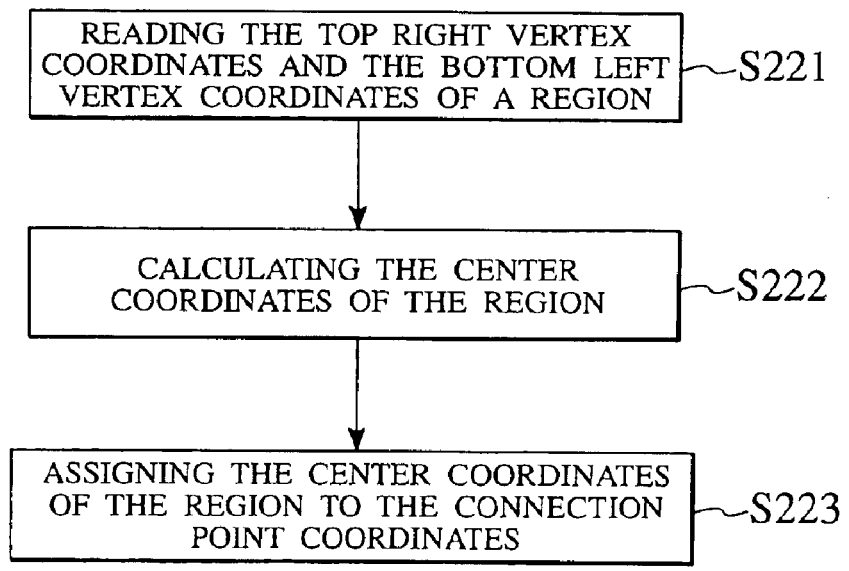

In the case that the top right vertex coordinates and the bottom left vertex coordinates of a region can be obtained as available coordinates of the region, as illustrated in FIG. 17B, the respective vertex coordinates are read in the step S221. The center coordinates of the region are then calculated by dividing the sum of the respective vertex coordinates by 2 in the step S222 and assigned to the connection point coordinates in the step S223.

The closer the connection points of the respective cells within a region is located to the center position of the region, the higher the accuracy of estimation is obtained. For example, this is the case with the cells c11 to c13 or the cells c21 to c24 of the region r1 or r2 as illustrated in FIG. 15.

However, in the case of a region such as the region r3 including a single large macro block, the connection points tend to be located away from the center position of the region so that the accuracy of estimation tends to becomes low.

Figure 18A:
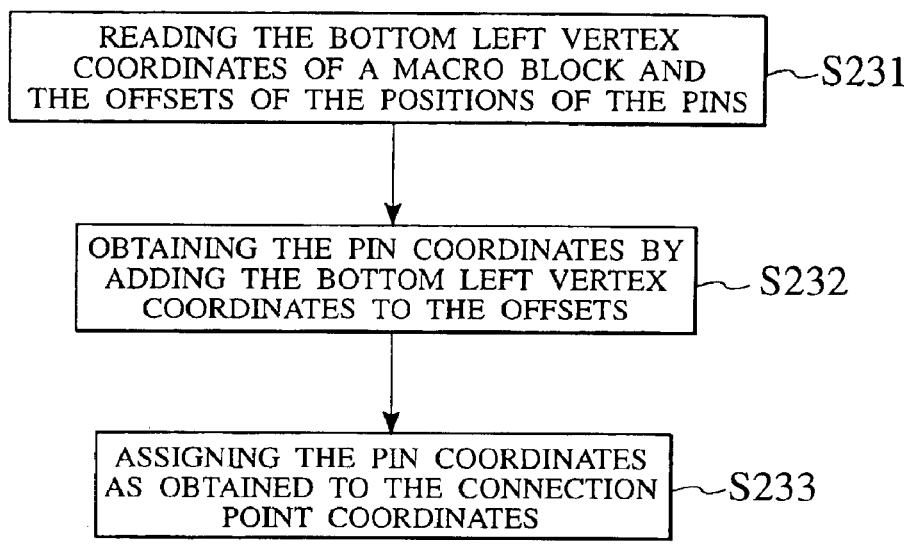
FIG. 18 is a flowchart showing the procedure of assigning the pin coordinates of macro blocks to connection point coordinates.

In such a case, as illustrated in FIG. 18A for example, the connection point coordinates can be obtained by reading the bottom left vertex coordinates of the macro block and the offsets of the positions of the pins in the step S231, adding the bottom left vertex coordinates to the offsets in order to obtain the pin coordinates in the step S232 and assigning the pin coordinates as obtained to the connection point coordinates in the step S233.

The accuracy of estimation is degraded if the center coordinates are assigned to the connection points in the same way even in the case of a region having connection points substantially apart from the center position of the region. It is possible for such a region to estimate the wire load with a high degree of accuracy by calculating the coordinates of the pins to be connected.

In the case that a cell is rotated, mirror-imaged and so forth in advance of placing cells, it is also possible to estimate the wire loads with a high degree of accuracy by taking this point into consideration to precisely calculate the connection points.

Figure 18B:
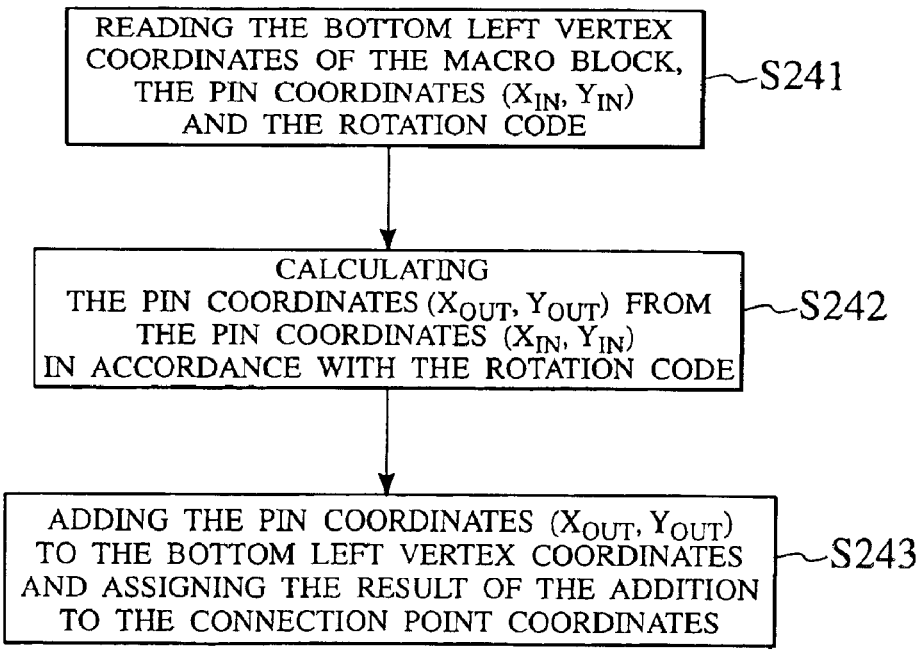

More specifically speaking, as illustrated in FIG. 18B for example, the connection point coordinates can be obtained by reading the bottom left vertex coordinates of the macro block, the pin coordinates (Xin,Yin) and the rotation code in the step S241, calculating the pin coordinates (Xout,Yout) from the pin coordinates (Xin,Yin) in accordance with the rotation code in the step S242 and adding the pin coordinates (Xout,Yout) to the bottom left vertex coordinates in order to obtain the coordinates to be assigned to the connection point coordinates in the step S243.

Also, the process of designing a chip in a hierarchical manner can be conducted by designing the core blocks to be used in the chip at the outset, and then combining the core blocks to construct the entirety of the chip. In this case, the layouts of cell groups of the respective regions in the lower layers are generated in the first step. The layout of an upper layer is then generated by treating the respective regions as macro blocks. In this case, it is required to determine the locations of the external terminals of the respective regions treated as macro blocks. Namely, the side is designated where each external pin is located, i.e., top, bottom, right or left, followed by calculating an optimal position of each external pin in accordance with the coordinates of the cell groups in the respective regions, and assigning the optimal positions of the respective external pins to the connection points.

Figure 19:
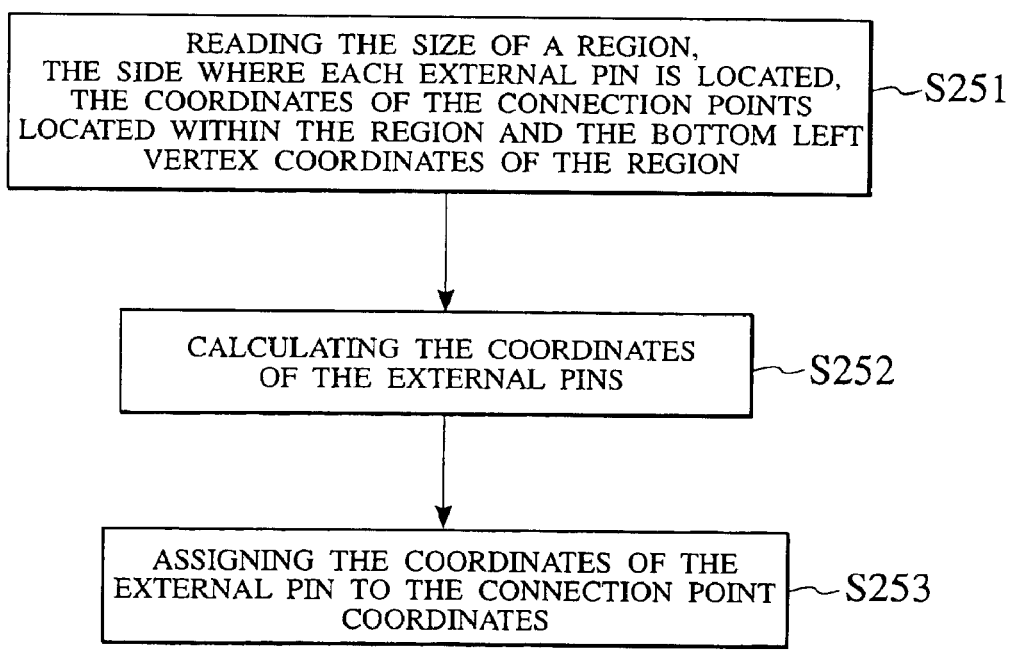
FIG. 19 is a flowchart showing the procedure of determining the coordinates of the external pins.

As illustrated in FIG. 19, for example, the size of the region, the side where each external pin is located, i.e., top, bottom, right or left, the coordinates of the connection points of the respective cells located within the region and the bottom left vertex coordinates of the region are read in the step S251 followed by calculating the coordinates of the external pins in the step S252.

The coordinates (x,y) relative to the bottom left vertex of the region are calculated as in the following description.

(a) In the case that an external pin is located on the left side of the region, (x,y)=(0,the average value of the y-coordinates of the connection points of the respective cells located within the region).

(b) In the case that an external pin is located on the right side of the region, (x,y)=(the width of the region, the average value of the y-coordinates of the connection points of the respective cells located within the region).

(c) In the case that an external pin is located on the top side of the region, (x,y)=(the average value of the y-coordinates of the connection points of the respective cells located within the region, the height of the region).

(d) In the case that an external pin is located on the bottom side of the region, (x,y)=(the average value of the x-coordinates of the connection points of the respective cells located within the region,0).

If the bottom left vertex coordinates of the region are (x0,y0), the coordinates (X,Y) of an external pin are calculated as X=x0+x, Y=y0+y.

It is possible to estimate the wire loads with a high degree of accuracy by assigning the coordinates of an external pin as calculated in this manner to the connection point coordinates in the step S253.

The region r5 as illustrated in FIG. 15 is an exemplary region including an external pin located on the left side as described above.

As explained above, in accordance with the first embodiment of the present invention, it is possible to estimate the wire loads of semiconductor integrated circuits such as LSIs with a high degree of accuracy as compared with the prior art technique making use of statistical data. It also means the improvement of the accuracy of simulation to improve the accuracy of estimation of the wire load. It is possible by the improvement of the accuracy to shorten the time required for completing the process of designing and therefore to shorten the time required for actually manufacturing semiconductor integrated circuits. Particularly, in today's competitive marketplace of semiconductor integrated circuits such as LSIs, it is needed to reduce the time from research/development to routine manufacturing. Accordingly, in accordance with the present embodiment, it is possible to reduce the time from designing a semiconductor integrated circuit to trial manufacture/development of semiconductor integrated circuits so that the industrial advantages and the importance thereof are extremely high.

[The Second Embodiment]

Figure 20:
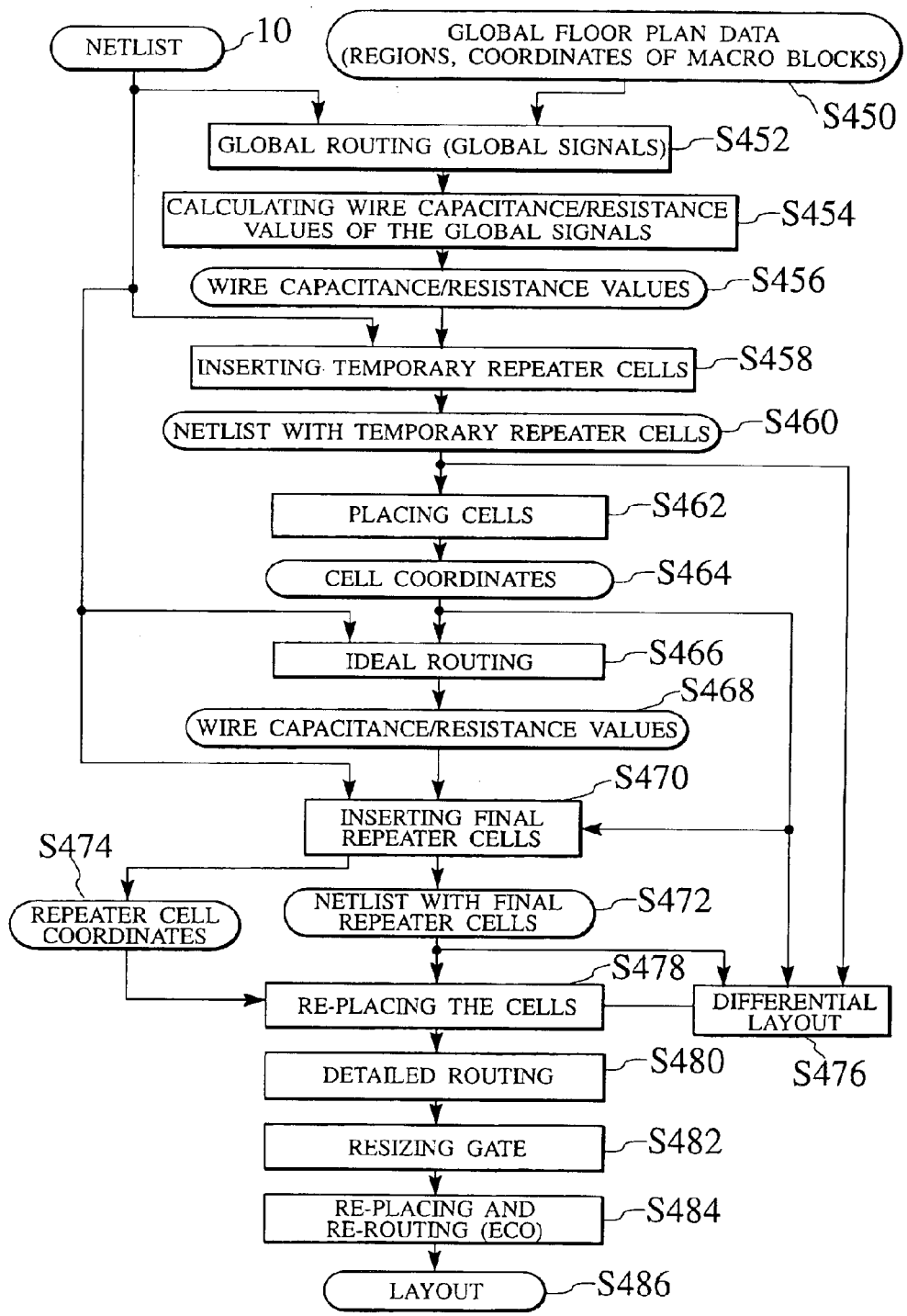
FIG. 20 is a flowchart showing the procedure of the method of inserting repeater cells in accordance with a second embodiment of the present invention.

As illustrated in FIG. 20, the method of inserting a repeater cell in accordance with the second embodiment comprises a global routing step S452 of routing signals exchanged between regions (global signals) on the basis of the netlist 10 and global floor plan data 450, a calculation step S454 of calculating the wire capacitance values and the wire resistance values of the global routing on the basis of the result of the global routing process, a temporary repeater cell inserting step S458 of temporarily inserting a repeater cell(s) and outputting the netlist 460 with a temporary repeater cell(s) after reading the netlist 10 and the wire capacitance values and the wire resistance values 456, a cell placing step S462 of outputting the cell coordinates by the use of the netlist 460 with a temporary repeater cell(s).

Also, as illustrated in FIG. 20, the method of inserting a repeater cell in accordance with the second embodiment comprises an ideal routing step S466 of performing ideal routing by the use of the netlist 10 and the cell coordinates 464 outputted as a result of placing cells and outputting the wire capacitance and resistance values 468 corresponding to the result of the ideal routing, a final repeater cell inserting step S470 of inserting a repeater cell(s) on the basis of the wire capacitance and resistance values 468 corresponding to the result of the ideal routing, a step S476 of calculating the differences of the netlist 472 with a final repeater cell(s) from the netlist 460 with a temporary repeater cell(s) and a step S478 of re-placing the cells in accordance with repeater cell coordinates 474.

Furthermore, as illustrated in FIG. 20, the method of inserting a repeater cell in accordance with the second embodiment comprises a step S480 of performing detailed routing process in accordance with the result of the re-placement, a gate resizing step S482 of adjusting the size of gates in order to optimize the loads on the basis of the wire capacitance values with respect to the result of the detailed routing process, and a step S484 of performing re-placement and re-routing on the basis of the result of the gate resizing step.

The global routing step S452 to the cell placement step S462 will be explained in the following description.

Figure 21:
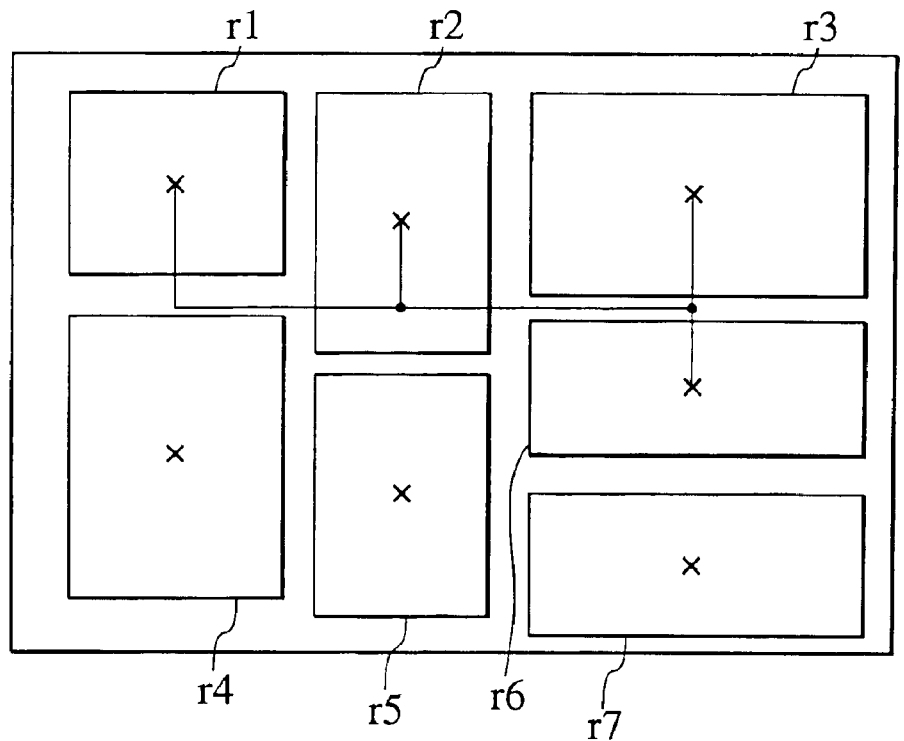
FIG. 21 is a schematic diagram showing the condition of the layout after the global routing process.

First, the global routing process is performed on the basis of the global floor plan data 450 in the step S452. The global floor plan data 450 includes the coordinates of the regions and the coordinates of the macro blocks. As illustrated in FIG. 21, the area of the chip has been divided into the regions r1 to r7 while the center coordinates of the respective regions are defined. The global routing process is performed in order to connect the center positions of the regions r1 to r3 and the center position of the region r6 with each other on the basis of the center coordinates and the netlist as illustrated in FIG. 21.

Next, the wire capacitance values and the wire resistance values of the global signals are calculated in the step S454 followed by outputting the result thereof. The steps explained so far may be executed similar to the first embodiment described above.

Figure 22:
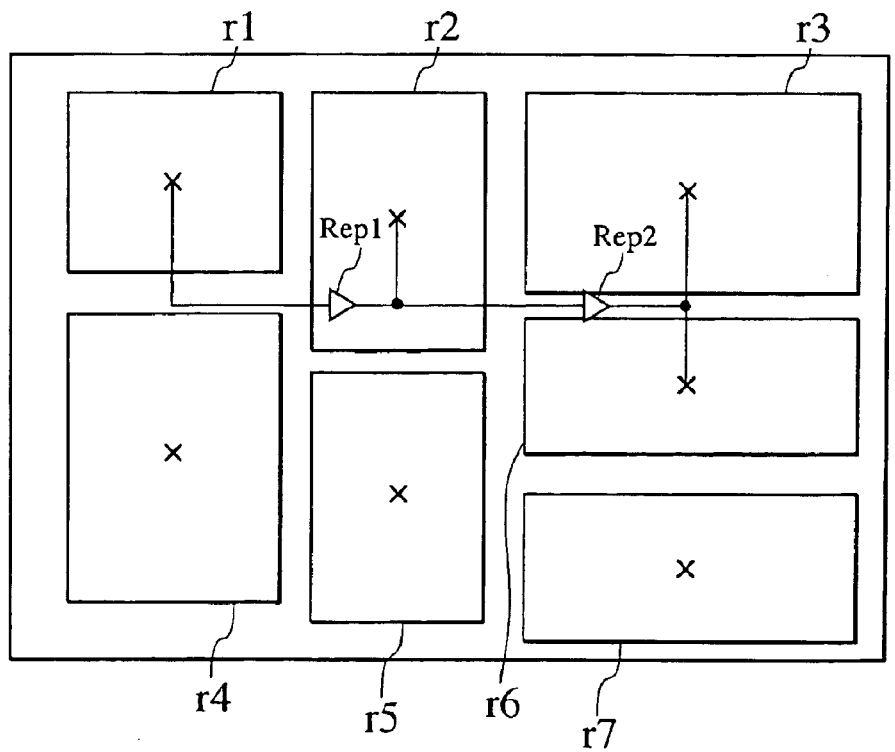
FIG. 22 is a schematic diagram showing the condition of the layout after inserting temporary repeater cells.

Next, temporary repeater cells are inserted on the basis of the wire capacitance values and the wire resistance values 456 in the step S458. FIG. 22 shows the result of inserting the temporary repeater cell(s) to the global routing result as illustrated in FIG. 21. As illustrated in FIG. 22, in the case that the wire load or the RC delay exceeds a predetermined level, the repeater cells Rep1 and Rep2 are inserted to separate the signal.

Next, the cells are placed on the basis of the netlist 460 with a temporary repeater cell(s) after inserting the temporary repeater cells. The detailed routing process of all the cells is then completed to obtain the cell coordinates 464.

Figure 23:
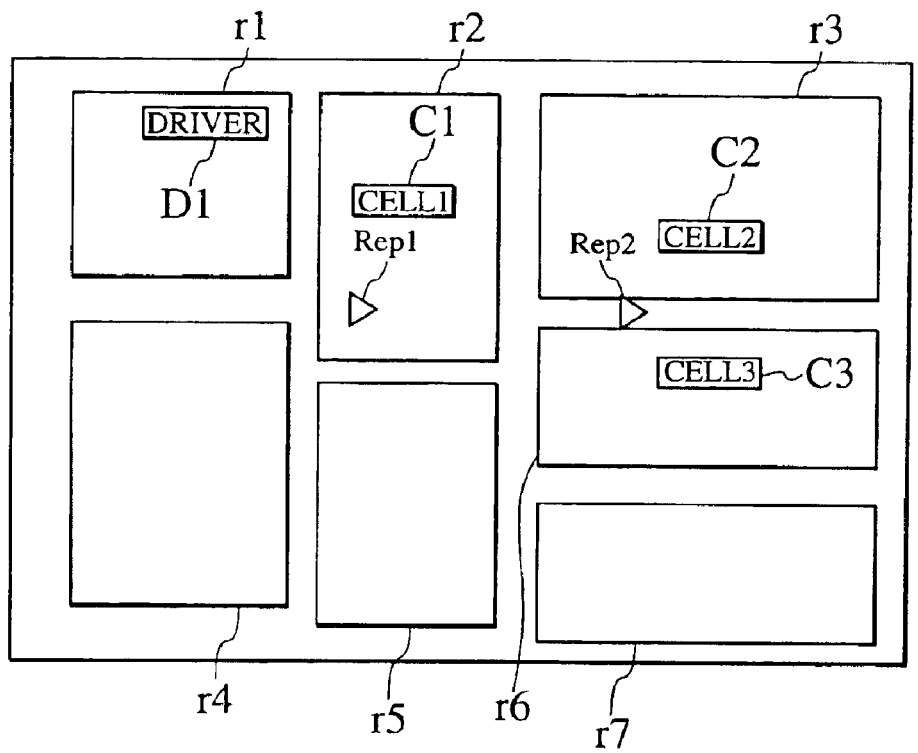
FIG. 23 is a schematic diagram showing the condition of the layout after placing the cells on the basis of the netlist with the temporary repeater cells.

FIG. 23 shows the condition of the layout after placing the cells. As illustrated in FIG. 23, a driver D1 and the cells C1 to C3 may be located apart from the center position of the respective regions. The driver circuit D1 is located spatially further distant from the repeater cell Rep1 than the center position of the region r1. The cell C1 is also distant from the repeater cell Rep1. On the other hand, the cell C2 is located closer to the repeater cell Rep2 than the center position of the region r3. The cell C3 is also located closer to the repeater cell Rep2.

Next, the ideal routing step S466 to the cell re-placing step S478 will be explained.

First, the ideal routing step S466 is performed by the use of the cell coordinates 464 in place of the global floor plan data 450 as used in the global routing step S452.

Figure 24:
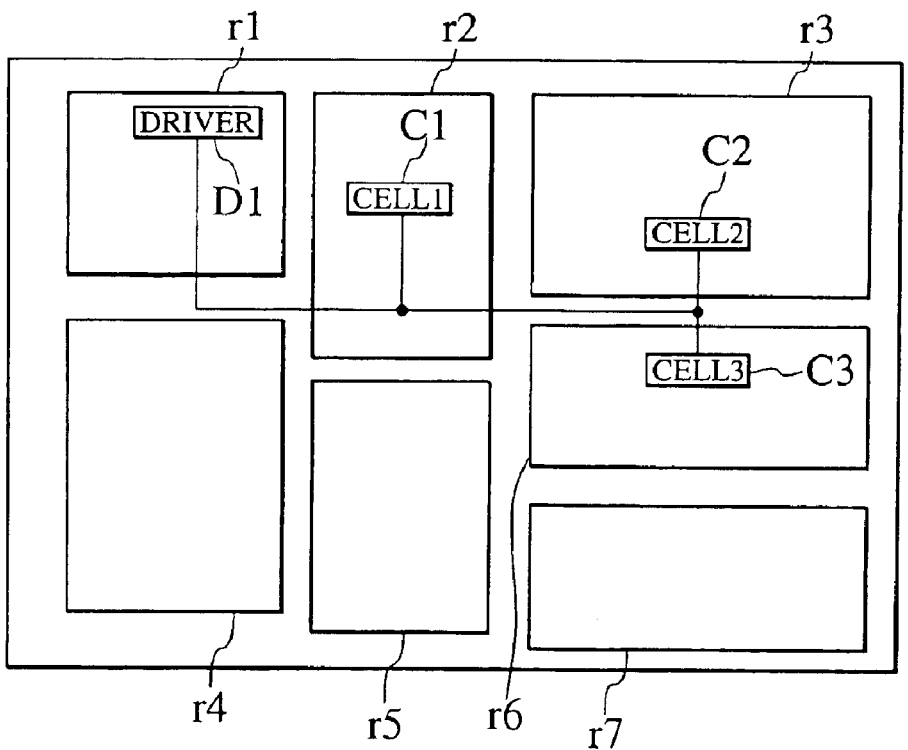
FIG. 24 is a schematic diagram showing the condition of the layout after the ideal routing process.

FIG. 24 shows the condition of the layout after ideal routing the cells. The ideal routing process is performed while disregarding existence of other wires. Namely, the ideal routing process is performed in order to minimize the wire length between regions bypass without taking a round about route to avoid other wires.

The final repeater cell inserting step S470 is performed by the use of the netlist 10 before inserting the repeater cell(s), the wire resistance values, the wire capacitance values 468 and the cell coordinates 464 which are obtained the result of the ideal routing step S466. In the final repeater cell inserting step S470, the netlist 472 with the final repeater cell(s) is output as well as the repeater cell coordinates 474 indicative of the position to which the repeater cell(s) is inserted.

The repeater cell is re-placed to the position as designated in the step S478 in accordance with the repeater cell coordinates 474, the netlist 472 with the final repeater cell(s) and the differences of the netlist 472 with the final repeater cell(s) from the netlist with the temporary repeater cell(s).

Figure 25:
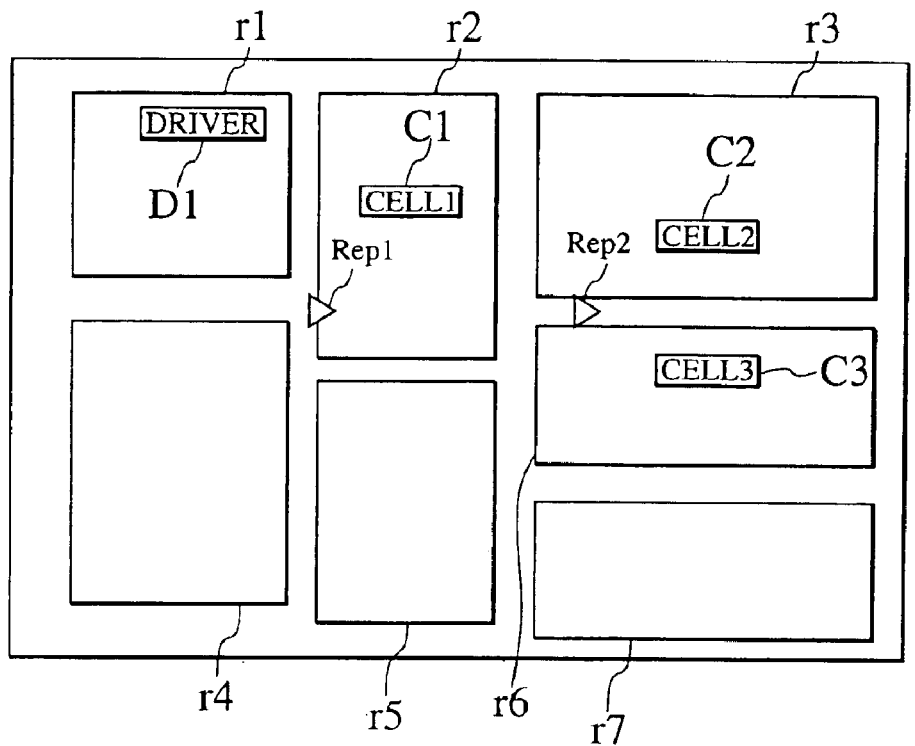
FIG. 25 is a schematic diagram showing the condition of the layout after inserting the final repeater cells.

FIG. 25 shows the condition of the layout after inserting the final repeater cell(s) and re-placing the cells. As described above, the global routing unit is performed on the assumption that cells and the like are placed the center positions of the respective regions. However, in the actual case, cells and the like may be located apart from the center position of the respective regions. For this reason, there is a difference between the location of the repeater cell after inserting a temporary repeater cell(s) as illustrated in FIG. 22 and the location of the repeater cell after inserting a final repeater cell(s) as illustrated in FIG. 25.

Figure 26:
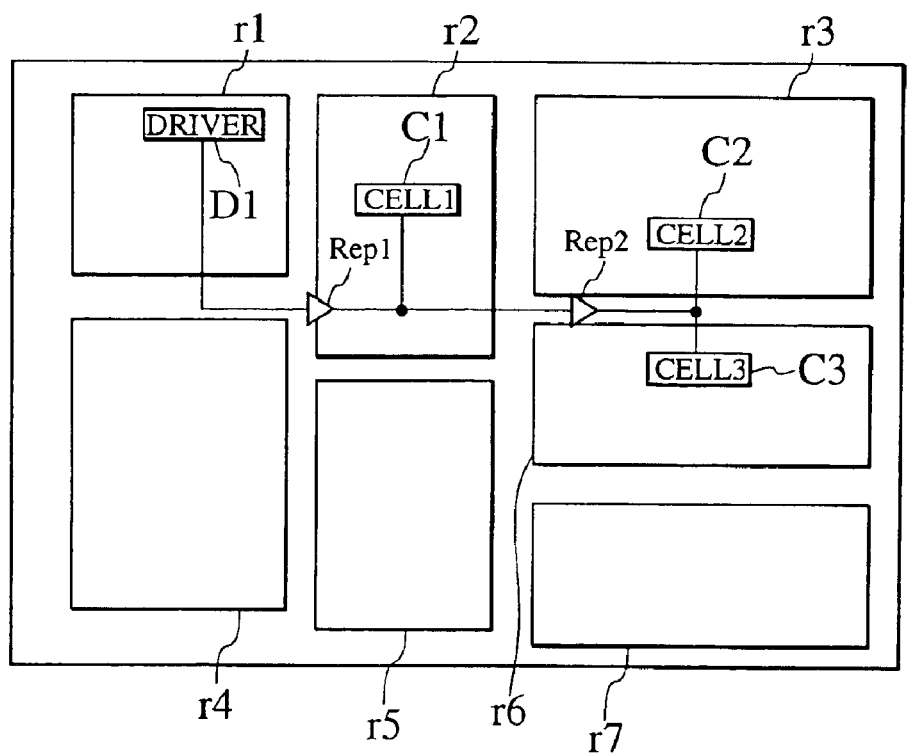
FIG. 26 is a schematic diagram showing the condition of the layout after the detailed routing process.

Next, the detailed routing process is performed in the step S480. FIG. 26 shows the condition of the layout after the detailed routing process.

Finally, the size of gates is adjusted in the step S482 in order to optimize the loads on the basis of the wire capacitance values on the basis of the result of the detailed routing process, followed by performing re-placement and re-routing in the step S484 in order to output the final layout 486.

As explained above, in accordance with the second embodiment, the netlist 460 for use in generating the first cell placement (S462) includes a repeater cell(s) which is temporarily inserted on the basis of the wire capacitance and resistance values 456 as estimated by the global routing and the global floor plan data 450, so as to reduce the increase in the size of the netlist when the final layout process is performed. Accordingly, it is possible to generate a final layout without substantially changing the original floor plan.

Also, since a repeater cell(s) is finally inserted at an appropriate position determined on the basis of the wire resistance and capacitance values 468 after the ideal routing step S466, the wiring paths are determined in accordance with the location of the repeater cell(s) and therefore it is possible to perform routing for a long path in a nearly ideal manner. For this reason, it is possible to perform routing up front a long wire, which would possibly be a critical path, with few detours in a nearly ideal manner.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A wire load estimating method comprising:

reading a netlist;

generating connection information including names of signals, identification names and names of pins of instances, wherein the instances include cells, macro blocks and synthesized blocks as described in said netlist;

dividing an area of a chip into two or more regions and determining connection point coordinates for each of said regions using said connection information and location of said instances as placed, the connection point coordinates of at least one of the regions being center coordinates of said region, wherein the center coordinates are calculated by adding top right vertex coordinates of said region to bottom left vertex coordinates of said region and dividing the result of the addition by 2;

determining a wiring path using said connection point coordinates; and estimating wire capacitance value and a wire reisistance value with reference to said wiring path.

2. A wire load estimating method comprising:

reading a netlist;

generating connection information including names of signal identification names and names of pins or instances, wherein the instances include cells, macro blocks and synthesized blocks as described in said netlist;

dividing an area of a chip into two or more regions and determining connection point coordinates for each of said regions using said connection information and locations of said instances as placed, the connection point coordinates of at least one of the regions being pin coordinates of the macro blocks located within said regions, wherein the pin coordinates of said macro block which is rotated or mirror-imaged are calculated using bottom left vertex coordinates of said macro block in a base condition, location of said pin coordinates relative to the bottom left vertex coordinates, and at least one of transformation types of rotation and mirror-imaging;

determining a wiring path by the use of said connection point coordinates; and estimating a wire capacitance value and a wire reisistance value with reference to said wiring path.

3. A wire load estimating method comprising:

reading a netlist;

generating connection information including names of signals, identification names and names of pins of instances, wherein the instances include cells, macro blocks and synthesized blocks as described in said netlist;

dividing an area of a chip into two or more regions and determining connection point coordinates for each of said regions using said connection information and locations of said instances as placed, wherein said connection point coordinates are calculated using bottom left vertex coordinates of said regions, indications of top side, bottom side, right side or left side of said regions on which the respective connection points are located, vertical or horizontal size of said regions, and coordinates of connection points of two or more instances;

determining a wiring path by the use of said connection point coordinates; and estimating a wire capacitance value and a wire reisistance value with reference to said wiring path.

4. A wire load estimating method comprising:

reading a netlist;

generating connection information including names of signals, identification names and names of pins of instances, wherein the instances include cells, macro blocks and synthesized blocks as described in said netlist;

dividing an area of a chip into two or more regions and determining connection point coordinates for each of said regions using said connection information and locations of said instances as placed;

determining a wiring path using said connection point coordinates by:

calculating a maximum value and a minimum value of x-coordinates, and y-coordinates, of a plurality of connection points which are connected to a same signal;

calculating a difference between the maximum value and the minimum value of said x-coordinates and said y-coordinates, and judging which side in the x-direction or the y-direction of a rectangular region including said connection points is longer than the other with reference to said differences;

arranging a root wire in the direction along the longer side;

connecting said root wire to a farthest one of said connection points from said root wire by means of a connection wire between the farthest connection point and the root wire; and connecting, by means of a connection wire, each of the remaining points of said connection points to either another one of the connection wires or the root wire, whichever is closest; and estimating a wire capacitance value and a wire reisistance value with reference to said wiring path.

5. The wire load estimating method of claim 4, wherein the step of connecting, by means of a connection wire, each of the remaining points of said connection points is executed in a sequence from the farthest connection point from said root wire to a closest connection point from said wire.

6. A wire load estimating method comprising:

reading a netlist;

generating connection information including names of signals, identification names and names of pins instances, wherein the instances include cells, macro blocks and synthesized blocks as described in said netlist;

dividing an area of a chip into two or more regions and determining connection point coordinates for each of said regions using said connection information and locations of said instances as placed;

determining a wiring path using said connection point coordinates;

estimating a wire capacitance value and a wire reisistance value with reference to said wiring path;

wherein a temporary repeater cell is inserted on the basis of the wire capacitance value and the wire resistance value; and wherein the respective instances are placed on the basis of the result of inserting the temporary repeater cell.

7. A computer program product for estimating a wire load comprising:

instructions configured to read a netlist;

instructions configured to generate connection information including names of signals, identification names and names of pins of instances, wherein the instances include cells, macro blocks and synthesized blocks as described in said netlist;

instructions configured to divide an area of a chip into two or more regions;

instructions configured to determine connection point coordinates for at least one of the regions by calculating center coordinates of the region by adding top right vertex coordinates of said region to bottom left vertex coordinates of said region and dividing the result of the addition by 2;

instructions configured to determine a wiring path by the use of said connection point coordinates; and instructions configured to estimate a wire capacitance value and a wire resistance value with reference to said wiring path.

8. A computer program product for estimating a wire load comprising:

instructions configured to read a netlist;

instructions configured to generate connection information including names of signals, identification names and names of pins of instances, wherein the instances include cells, macro blocks and synthesized blocks as described in said netlist;

instructions configured to divide an area of a chip into two or more region;

instructions configured to determine connection point coordinates for at least one of the regions by using pin coordinates of a rotated or mirror-imaged macro block which is located within said regions by using bottom left vertex coordinates of said macro block in a base condition, location of said pin coordinates relative to the bottom left vertex coordinates, and at least one of transformation types of rotation and mirror-imaging;

instructions configured to determine a wiring path by the use of said connection point coordinates; and instructions configured to estimate a wire capacitance value and a wire resistance value with reference to said wiring path.

9. A computer program product for estimating a wire load comprising:

instructions configured to read a netlist;

instructions configured to generate connection information including names of signals, identification names and names of pins of instances, wherein the instances include cells, macro blocks and synthesized blocks as described in said netlist;

instructions configured to divide an area of a chip into two or more regions;

instructions configured to determine connection point coordinates for at least one of said regions by using bottom left vertex coordinates of said region, indications of top side, bottom side, right side or left side of said region on which the respective connection points are located, vertical or horizontal size of said region, and the coordinates of the connection points of two or more instances;

instructions configured to determine a wiring path by the use of said connection point coordinates; and instructions configured to estimate a wire capacitance value and a wire resistance value with reference to said wiring path.

10. A computer program product for estimating a wire load comprising:

instructions configured to read a netlist;

instructions configured to generate connection information including names of signals, identification names and names of pins of instances which include cells, macro block and synthesized blocks as described in said netlist;

instructions configured to divide an area of a chip into two or more regions and determining connection point coordinates for each of said regions by the use of said connection information and locations of said instances as placed;

instructions configured to determine a wiring path using said connection point coordinates by:

calculating a maximum value and a minimum value of the x-coordinates and y-coordinates of a plurality of the connection points which are connected to a same signal;

calculating a difference between maximum value and the minimum value of said x-coordinates and said y-coordinates, and judging which side in the x-direction or the y-direction of a rectangular region including said connection points is longer than the other with reference to said differences;

arranging root wire in the direction along the longer side;

connecting said root wire to a farthest one of said connection points from said root wire by means of a connection wire between the farthest connection point and the root wire; and connecting, by means of a connection wire, each of the remaining points of said connection points to either another one of the connection wires or the root wire, whichever is closest; and instructions configured to estimate a wire capacitance value and a wire resistance value with reference to said wiring path.

11. The computer program product for estimating a wire load of claim 10, wherein the step of connecting, by means of a connection wire, each of the remaining points of said connection points in the instructions configured to determine a wiring path using said connection point coordinates is executed in a sequence from the farthest connection point from said root wire to a closest connection point from said wire.

12. A computer program for estimating a wire load comprising:

instruction configured to read a netlist;

instruction configured to generate connection information including names of signals, identification names and names of pins of instances, wherein the instances include cells, macro blocks and synthesized blocks as described in said netlist;

instructions configured to divide an area of a chip into two or more regions and determining connection point coordinates for each of said regions using said connection information and locations of said instances as placed;

instructions configured to determine a wiring path using said connection point coordinates;

instructions configured to estimate a wire capacitance value and a wire resistance value with reference to said wiring path; and instructions configured to insert a temporary repeater cell on the basis of the wire capacitance value and the wire resistance value; and instructions configured to place the respective instances on the basis of the result of inserting the temporary repeater cell.

* * * * *